(12) United States Patent
Topaz

(10) Patent No.: US 11,352,263 B2
(45) Date of Patent: Jun. 7, 2022

(54) ELECTRO-LESS PRODUCTION OF SILICON NANOWIRES AND PLATES IN A SOLUTION

(71) Applicant: GIORA TOPAZ POWDER COATING (2007) LTD., Even Yehuda (IL)

(72) Inventor: Giora Topaz, Herzliya (IL)

(73) Assignee: GIORA TOPAZ POWDER COATING (2007) LTD., Even Yehuda (IL)

( * ) Notice: Subject to any disclaimer, the term of this patent is extended or adjusted under 35 U.S.C. 154(b) by 0 days.

(21) Appl. No.: 16/060,959

(22) PCT Filed: Nov. 30, 2017

(86) PCT No.: PCT/IL2017/051306
§ 371 (c)(1),
(2) Date: Jun. 11, 2018

(87) PCT Pub. No.: WO2019/106645
PCT Pub. Date: Jun. 6, 2019

(65) Prior Publication Data
US 2020/0317530 A1 Oct. 8, 2020

(51) Int. Cl.
*C01B 33/021* (2006.01)
*B01J 23/50* (2006.01)
(Continued)

(52) U.S. Cl.
CPC .......... *C01B 33/021* (2013.01); *B01J 23/50* (2013.01); *B01J 23/52* (2013.01); *B01J 23/72* (2013.01);
(Continued)

(58) Field of Classification Search
CPC .. B82Y 3/00; B82Y 40/00; C30B 7/14; C30B 29/60; C30B 29/06; C30B 29/64;
(Continued)

(56) References Cited

U.S. PATENT DOCUMENTS

| 5,372,726 A * | 12/1994 | Straten | C02F 1/5236 210/728 |
| 8,507,376 B2 * | 8/2013 | Ewert | C25D 5/022 438/614 |
| 2015/0086871 A1 | 3/2015 | Cao et al. | |

FOREIGN PATENT DOCUMENTS

| CN | 102951676 A | 3/2013 |
| CN | 103212426 A | 4/2013 |

(Continued)

OTHER PUBLICATIONS

El-Saharty et al. (NPL: Sodium diethyldithiocarbamate as accelerator of the rate of copper cementation, Egyptian journal of Aquatic research (2015), 41, pp. 289-293).*

(Continued)

*Primary Examiner* — Smita S Patel
(74) *Attorney, Agent, or Firm* — Soroker Agmon Nordman

(57) ABSTRACT

A solution and method of creating such for producing silicon nanowires or silicon nano-plates. The solution comprising distilled water, Potassium Hydroxide (KOH), at least one catalyst, Sodium Methyl Siliconate ($CH_5NaO_3Si$), Ethylenediaminetetraacetic Acid (EDTA), which act as a first chelating agent, Sodium Diethyldithiocarbamate ($C_5H_{10}NS_2Na$), which acts as a second chelating agent, and Dimethylacrylic Acid, which acts as a buffer that is able to regulate the amount of silicon nanowires or plates formed and to prevent agglomeration. The concentration of the Sodium Diethyldithiocarbamate in the solution is greater than concentration of the EDTA in the solution for forming a plurality of thick and short nanowires, and the concentration of the Sodium Diethyldithiocarbamate in the solution is less than the concentration of the EDTA in the solution for forming a plurality of thin and long nanowires.

8 Claims, 21 Drawing Sheets

(51) Int. Cl.
  *B01J 23/52* (2006.01)
  *B01J 23/72* (2006.01)
  *B01J 23/86* (2006.01)
  *B01J 35/00* (2006.01)
  *B01J 35/06* (2006.01)

(52) U.S. Cl.
  CPC ......... *B01J 23/862* (2013.01); *B01J 35/0013* (2013.01); *B01J 35/06* (2013.01); *C01P 2004/03* (2013.01); *C01P 2004/04* (2013.01); *C01P 2004/16* (2013.01); *C01P 2004/24* (2013.01)

(58) Field of Classification Search
  CPC . H01L 29/06; C23C 18/1633; C23C 18/1619; C23C 18/1657; C23C 18/1658; C23C 18/166; C23C 18/1662; C23C 18/1664; C23C 18/168; B01J 23/50; B01J 23/52; B01J 23/72; B01J 23/862; B01J 35/06; B01J 35/0013; B01J 35/00; C01B 33/021; C01P 2004/04; C01P 2004/16; C01P 2004/24; C01P 2004/03
  See application file for complete search history.

(56) References Cited

FOREIGN PATENT DOCUMENTS

| | | |
|---|---|---|
| CN | 103764544 A | 4/2014 |
| CN | 104725432 A | 6/2015 |
| KR | 20090129579 | 12/2009 |
| WO | 2013/016339 A1 | 1/2013 |

OTHER PUBLICATIONS

KR20090129579, machine translation, 2009.*
Nae-Man Park, Chel-Jong Choi, "Growth of silicon nanowires in aqueous solution under atmospheric pressure", Nano Research, 7(6), 898-902, 2014, (DOI 10.1007/s12274-014-0451-x).
N Crowther: "Iron-containing silicalites for phenol catalytic wet peroxidation", Applied Catalysis. B, Environmental, vol. 46, No. 2, Nov. 10, 2003 (Nov. 10, 2003), pp. 293-305, XP055001969, ISSN: 0926-3373, DOI: 10.1016/30926-3373(03)00224-8 "2.1. Catalyst preparation"; p. 295.

* cited by examiner

ELECTRO-LESS PRODUCTION OF SILICON NANOWIRES AND PLATES IN A SOLUTION

FIELD OF THE INVENTION

The present disclosure generally relates to the production of silicon nanowires, and more specifically to production of silicon nanowires and/or plates in a solution and on top of a mesh, without excessive heating the solution and/or the use of external direct electrical current.

BACKGROUND

Silicon nanowires possess unique properties and qualities, these unique physical and chemical qualities made them a favorable and desired material in the micro-electronics industry. Silicon nanowires are traditionally produced using a Chemical Vapor Deposition (CVD) process. During the CVD process the substrate may be exposed to a source material which may be carried by a gas into the reactor. In the reactor, the substrate, gas and source material may be heated to temperature that exceeds 200° C. and/or a vacuum may be created. The high temperature and/or vacuum and constant flow of the source material may enable the source material to react with the substrate surface and settle on it, producing the desired deposit e.g. silicon nanowires. Recently performed research may suggest the possibility of growing silicon nanowires using other methods. However, the other methods may disclose heating a reactor and/or a solution to even higher temperatures than previously presented, for example 300° C. or more. Other disclosed methods may include the use of direct electrical current to facilitate the reaction, which may require the use of even more energy.

DESCRIPTION OF PRIOR ART

Nano Research Growth of silicon nanowires in aqueous atmospheric pressure—Nae-Man Park and Chel-Jong Choi; Tsinghua University press Mar. 12, 2014.

SUMMARY

According to an aspect of some embodiments of the present invention there is provided a composting for creating silicon nanowires or silicon nano-plates, said composition comprising: Potassium Hydroxide (KOH), at least one catalyst, Sodium Metal Siliconate (Na2SiO2) and Ethylenediaminetetraacetic Acid (EDTA), which acts as a first chelating agent.

Optionally, the composition's catalyst further comprises at least one metallic compound possessing metallic characteristics.

Optionally, the composition further comprises Sodium Diethyldithiocarbamate (C5H10NS2Na), which acts as a second chelating agent.

Optionally, the composition further comprises a short organic compound, which acts as a buffer that is able to regulate the amount of silicon nanowires or plates formed and to prevent agglomeration.

Optionally, the ratio between the EDTA and the Sodium Diethyldithiocarbamate further determines the nanowires structure formed in the solution e.g. long and thin nanowires or short and thick nanowires.

Optionally, the composition's short organic compound is acidic.

Optionally, the composition's short organic compound is Dimethylacrylic Acid.

Optionally, the composition's metallic compound further comprises gold, silver, cooper, stainless steel or a combination thereof.

Optionally, the composition's metallic compound further comprises a mesh.

Optionally, the composition's metallic compound further includes nano metallic particles smaller than 40 nanometer.

According to another aspect of some embodiments of the present invention there is provided a method for creating a solution enabling the production of silicon nanowires or silicon nano-plates, said method comprising: introducing into a basin distilled water, introducing into said solution Potassium Hydroxide (KOH), which acts as an electron mediator, forming a homogenized solution, warming said solution up to 75 degrees Celsius and keeping the solution below boiling point, introducing into said solution at least one catalyst, introducing into said solution Sodium Methyl Siliconate, introducing into said solution Ethylenediaminetetraacetic Acid (EDTA), which acts as a first chelating agent, and introducing into said solution Sodium Diethyldithiocarbamate (C5H10NS2Na), which acts as a second chelating agent, introducing into said solution a short organic compound, wherein the nanowires or plates are formed using the catalyst, and wherein the organic compound, acts as a buffer to control the amount of silicon nanowires or plates formed and to prevent agglomeration.

Optionally, the method further controls the ratio between the EDTA and the Sodium Diethyldithiocarbamate, which determines the nanowires structure formed in the solution e.g. long and thin nanowires or short and thick nanowires.

Optionally, the method further controls forming longer and thinner nanowires by introducing more EDTA compared to Sodium Diethyldithiocarbamate.

Optionally, the method further controls forming shorter and thicker nanowires by introducing less EDTA compared to Sodium Diethyldithiocarbamate.

Optionally, the method's short organic compound is acidic.

Optionally, the method's short organic compound is Dimethylacrylic Acid.

Optionally, the method's catalysts further comprises at least one metallic compound possessing metallic characteristics.

Optionally, the method's metallic compound further comprises a mesh.

Optionally, the method's metallic mesh further comprises gold, silver, cooper, stainless steel or a combination thereof.

Optionally, the method's metallic compound further includes nano metallic particles smaller than 40 nanometer.

Optionally, the method's organic compound further bonds with the second chelating agent, preventing the formation of nanowires or plates.

Optionally, the method's KOH presence in said solution is higher than a 0.5 grams per 100 cc.

Optionally, the method further comprises a solution of 100 cc which further comprises of 1 to 3 grams of Potassium Hydroxide (KOH), 20 to 50 cc of Sodium Silicanate, 0.35 to 0.55 grams of EDTA, 0.35 to 0.6 grams of C5H10NS2Na, 0.15 to 0.25 grams of the organic compound.

Optionally, the method further comprises extracting the nanowires or plates from said solution which further comprises of: warming the basin to at least 100 degrees Celsius to evaporate the solution e.g. the solution is concentrated from 100 cc to 30 cc, adding to the basin between 25-35 cc of ethanol, warming the basin to at least 100 degrees Celsius to evaporate the solution e.g. the solution is concentrated from 50 cc to 30 cc; and adding to the basin between 25-35 cc of ethanol and letting the solution rest until two distinctive phases are formed in the solution, wherein the silicon nanowires or plates float on top of the upper phase and the byproducts sink in the lower phase.

Optionally, the method further comprises extracting the metallic compound from the solution and rinsing the metallic compound with distilled water, and then drying the metallic compound.

BRIEF DESCRIPTION OF THE DRAWINGS

Some non-limiting exemplary embodiments or features of the disclosed subject matter are illustrated in the following drawings.

In the drawings.

Figure 1:
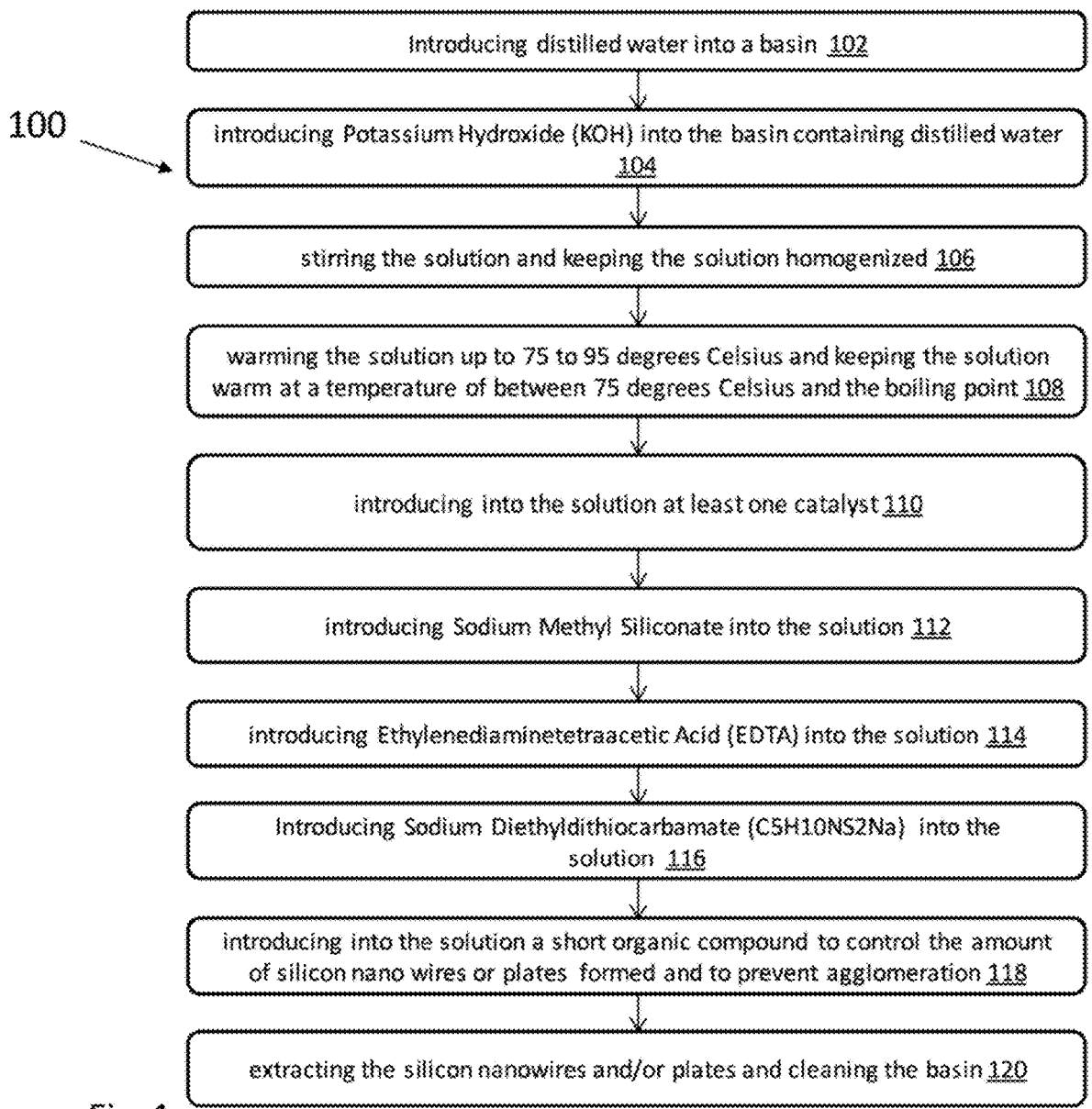
FIG. 1 is a schematic flowchart illustrating a method for producing silicon nanowires and/or plates, according to some embodiments of the present invention.

With specific reference now to the drawings in detail, it is stressed that the particulars shown are by way of example and for purposes of illustrative discussion of some embodiments of the invention. In this regard, the description taken with the drawings makes apparent to those skilled in the art how embodiments of the invention may be practiced.

Identical or duplicate or equivalent or similar structures, elements, or parts that appear in one or more drawings are generally labeled with the same reference numeral, optionally with an additional letter or letters to distinguish between similar entities or variants of entities, and may not be repeatedly labeled and/or described. References to previously presented elements are implied without necessarily further citing the drawing or description in which they appear.

Dimensions of components and features shown in the figures are chosen for convenience or clarity of presentation and are not necessarily shown to scale or true perspective. For convenience or clarity, some elements or structures are not shown or shown only partially and/or with different perspective or from different point of views.

DETAILED DESCRIPTION

Some embodiments of the present invention provide an easy and an energy saving method for creating silicon nanowires and/or silicon nano-plates. Silicon nanowires have been traditionally produced by using a Chemical Vapor Deposition (CVD) reactor and/or other energy consuming methods and/or techniques. The known methods may require heating a solution and/or a reactor to more than 200° C., creating vacuum in a reactor and/or by using an external electrical current to facilitate the reaction responsible for the production of silicon nanowires. High temperatures, vacuum and/or the use of external direct electrical current, may be used to overcome the energy activation point of the electron transfer mechanism required, in the production process of silicon nanowires. Using such methods, techniques and/or reactors may require special equipment and the use of a lot of energy, which may cause the production of silicon nanowires to be expensive.

According to some embodiments of the present invention, the method disclosed may reduce the production cost, simplify the production process of silicon nanowires and/or enable the production of silicon nano-plates. The method disclosed herein suggest that given special conditions, the energy activation point, for the production of silicon nanowires, may be lowered without the need to use excessive heating and/or direct electrical current. For example, the reaction between Sodium Methyl Siliconate and a catalyst, for example a metallic compound, may occur without the need of an external direct electrical current, creating vacuum and/or the heating of the surrounding area, solution and/or reactor for more than 100° C.

According to some embodiments of the present invention, the use of an alkaline solution, for example Potassium Hydroxide (KOH), may help to lower the energy activation point in the process of producing silicon nanowires and/or plates. For example, KOH may be used as an electron mediator, enabling easier transfer of a silicon anion which may be negatively charged, to a catalyst, which may be positively charged. For example, ions may transfer from Sodium Methyl Siliconate to a metallic compound. To further lower the energy activation point, the use of one or more chelating agents, designated for the desired compounds, may be possible. For example. Sodium Diethyldithiocarbamate and/or Ethylenediaminetetraacetic Acid (EDTA), may be used as chelating agents for Sodium Methyl Siliconate and a metallic compound, respectively. Therefore, by using a designated solution and/or chelating agents, the production of silicon nanowires may be achieved without the requirements of energy consumption methods and/or expensive equipment.

Furthermore, according to some embodiments of the present invention, the method disclosed may also enable the production of silicon nano-plates, which no method and/or previously known technique teach about. Whereas silicon nanowires may be constructed to have the same width and thickness, silicon nano-plates may be constructed of any silicon nano structure. For example, a silicon nano-plate's structure may vary in size, e.g. there may be a difference in size between their width and thickness. For example, when the width is bigger than the silicon nano-plate's thickness. The production of silicon nano-plates may be achieved by using the method disclosed herein and the use of a metallic mesh as the catalyst. However, the use of silicon nano-plates and there potential performance possibilities are not yet known in the micro-electronics industry, since they are first described herein.

Moreover, according to some embodiments of the present invention, the method disclosed may enable the production of silicon nanowires and/or plates at the highest purity level. For example, the formation of the silicon nanowires and/or plates may be a crystal formation.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 2:
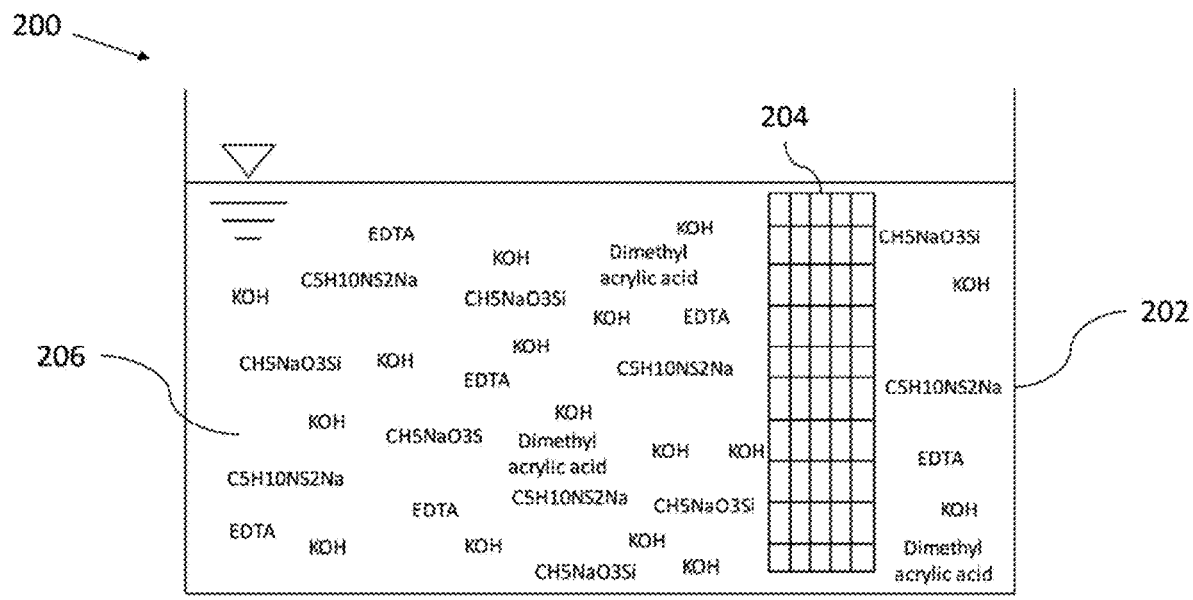
FIG. 2 is a schematic illustration of an exemplary basin, facilitating a solution enabling production of silicon nanowires and/or plates, according to some embodiments of the present invention.

Reference is now made to FIG. 1, which is a schematic flowchart, illustrating method 100 for producing silicon nanowires and/or plates, according to some embodiments of the present invention. As indicated in block 102, distilled water may be inserted into basin 202, as shown in FIG. 2. Basin 202 may have a lid, and may be closed or kept open during the process of the creation of silicon nanowires and/or plates.

As indicated in block 104, Potassium Hydroxide (KOH) may be inserted into the distilled water. For example, KOH is the first chemical and/or compound inserted into the distilled water in the process described herein. KOH may be introduced into the distilled water at a concentration of between 1 gram (gr) to 3 gr per 100 cc of distilled water. This concentration may enable the production of the required solution. In some embodiments of the present invention, the presence of KOH is crucial for the production of nanowires in the solution. For example, in order for silicon nanowires to form in solution 206, the concentration of KOH in the solution may be more than 0.5 grams per 100 cc of distilled water. It should be noted that adding more than 3 grams of KOH per 100 cc of distilled water, will not limit the production of silicon nanowires and/or plated. However, by introducing more than 3 grains of KOH per 100 cc of distilled water may enhance the production of byproducts in the solution, for example salt wires. An excessive production of byproducts may limit the ability to successful extract the produced silicon nanowires and/or plates. KOH may act as an elector mediator, therefore its concentration in solution 206 may determine the effectiveness of the process. For example, a concentration of KOH which is lower than 0.5 grams per 100 cc of distilled water may not be sufficient to facilitate a contact path which may enable a negatively charged silicon ion to encounter with a positively charged catalyst ion, e.g. not enough ions may transfer to facilitate a successful production of silicon nanowires and/or plates.

Figure 3:
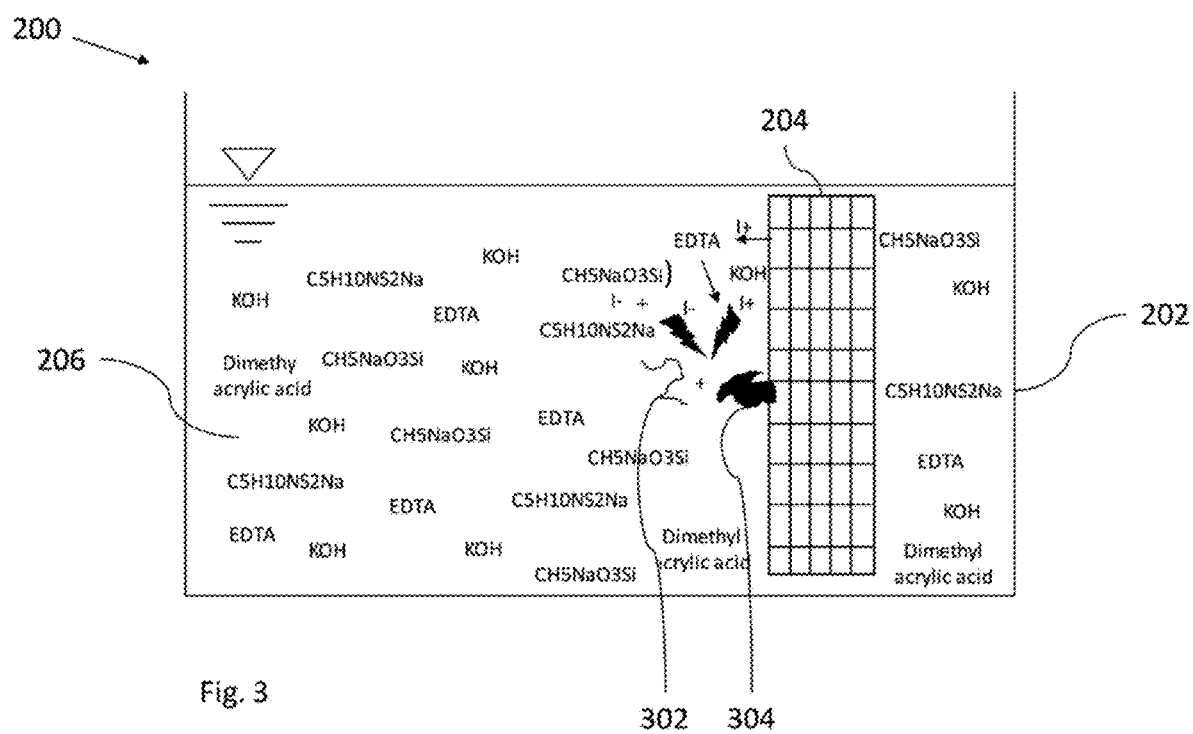
FIG. 3 is a schematic illustration of a reaction between two or more compounds in a solution which may result in the production of silicon nanowires and/or plates, according to some embodiments of the present invention.

As indicated in block 106, solution 206 may be well mixed and kept homogenized in order to facilitate a successful and productive reaction, as illustrated in FIG. 3. The engagement between the required compounds may be crucial for a successful production of silicon nanowires and/or plats in the solution. For example, solution 206 may be stirred throughout the entire process at a speed of between 150 and 300 Rounds Per Minute (RPM), for a mixture containing 100 cc. In addition, solution 206 may be kept under atmospheric pressure. e.g. there is no special requirement for alternating the surrounding pressure in order to generate a successful reaction, which may result in the production of silicon nanowires and/or plates. It should be noted that increasing and/or decreasing the pressure of solution 206 may not change the outcome. e.g. nanowires and/or plates may be produced in solution 206, regarding the increase and/or decrease of the pressure the solution is placed in.

As indicated in block 108, solution 206 may be warmed to a temperature of between 75° C. to 95° C. under atmospheric pressure, and kept warm at a temperature of between 75° C. and boiling point during the entire production process of silicon nanowires and/or plates. It should be noted that the disclosed range of temperatures, is indicated for optimal performance only, and that silicon nanowires and/or plates may be produced at other temperatures.

As indicated in block 110, a catalyst may be introduced into the solution, for example a metallic compound. For example, metallic mesh 204 may be submerged in solution 206 as illustrated in FIGS. 2 and 3. The metallic compound may act as a catalyst in the production process of silicon nanowires and/or plates. A successful catalyst may possess the ability to lower the activation point of a desired process. For example, a metallic compound, possessing metallic characteristics, may act as catalyst in the production process of silicon nanowires and/or plates. For example, during the production process ions may transfer from the silicon compound, which may be negatively charged, to the catalyst, for example the metallic compound, which may be positively charged. It should be noted that a successful catalyst may be one of the key elements in the production process of silicon nanowires and/or plates.

During the production process of silicon nanowires and/or plates, silicon ions, which may be negatively charged, may be drawn to the catalyst, which may be positively charged. Due to the potential difference between the silicon ions and the catalyst, the ions may migrate towards the catalyst and start to accumulate on it and/or one to another, while at least one silicon ion is adhesive to the catalyst. For example, a silicon ion may migrate from the silicon compound and bind to the metallic compound. The rest of the migrating ions, from the silicon compound, may then bind to the first ion adhesive to the metallic compound, and form a chain of silicon ions, e.g. form a silicon nanowire. When the silicon ions bond to each other in more than one axis, for example on a plain, a silicon nano-plate may then be formed.

Figure 4A:
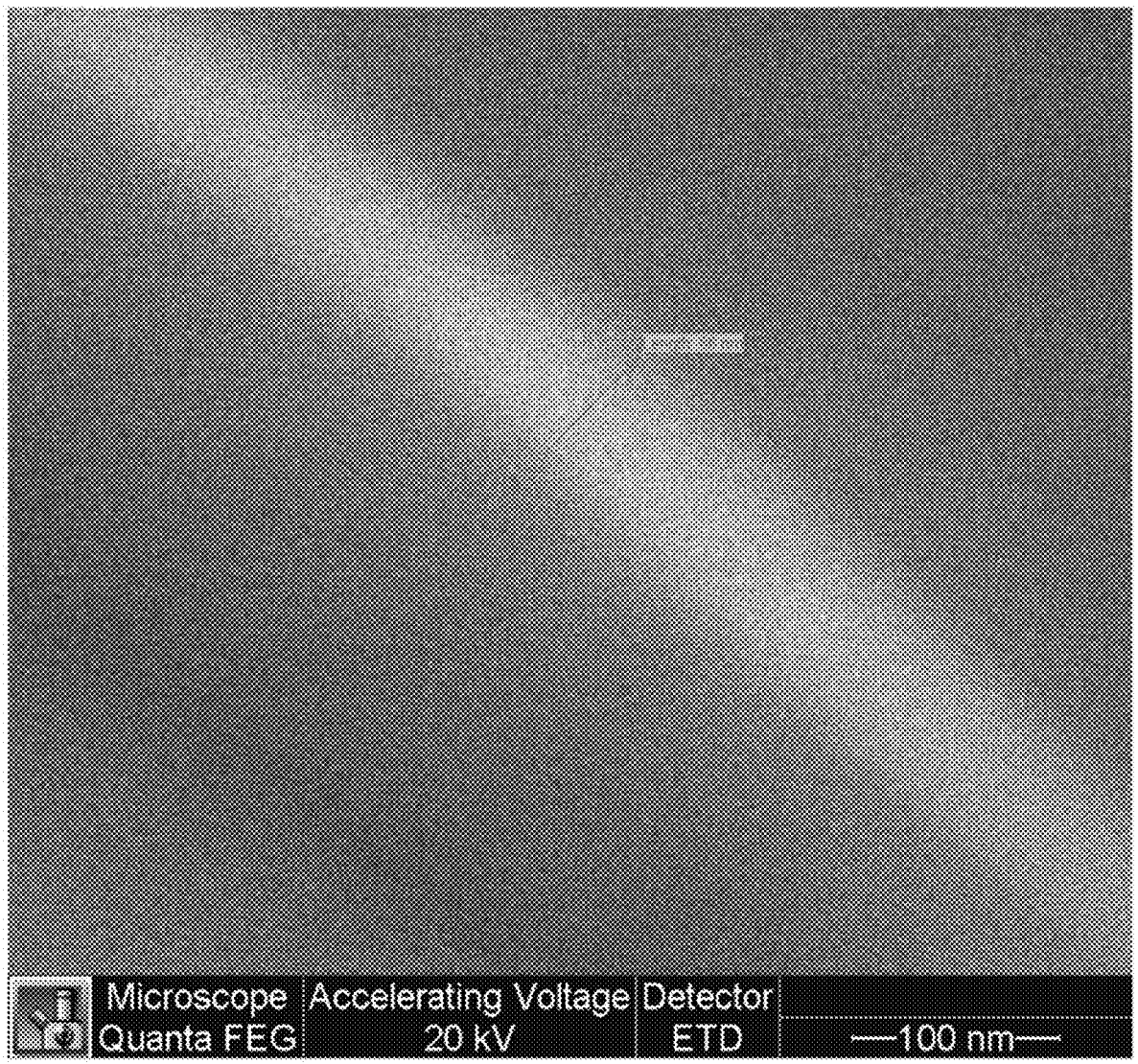
FIGS. 4A and 4B are photographs showing silicon nanowires and plates, the photograph was taken using a Scanning Electron Microscope (SEM)
Figure 4B:
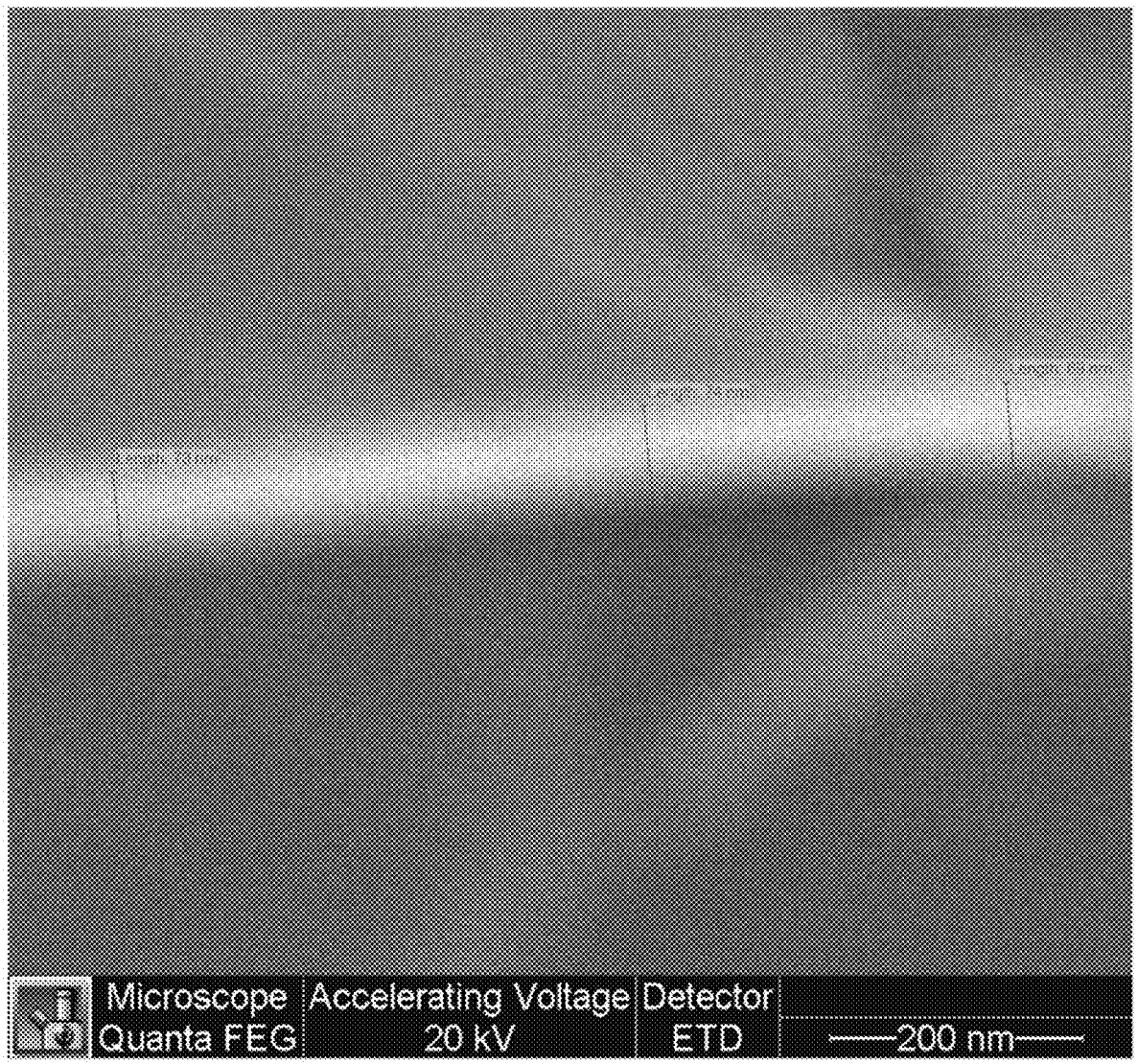
Figure 4C:
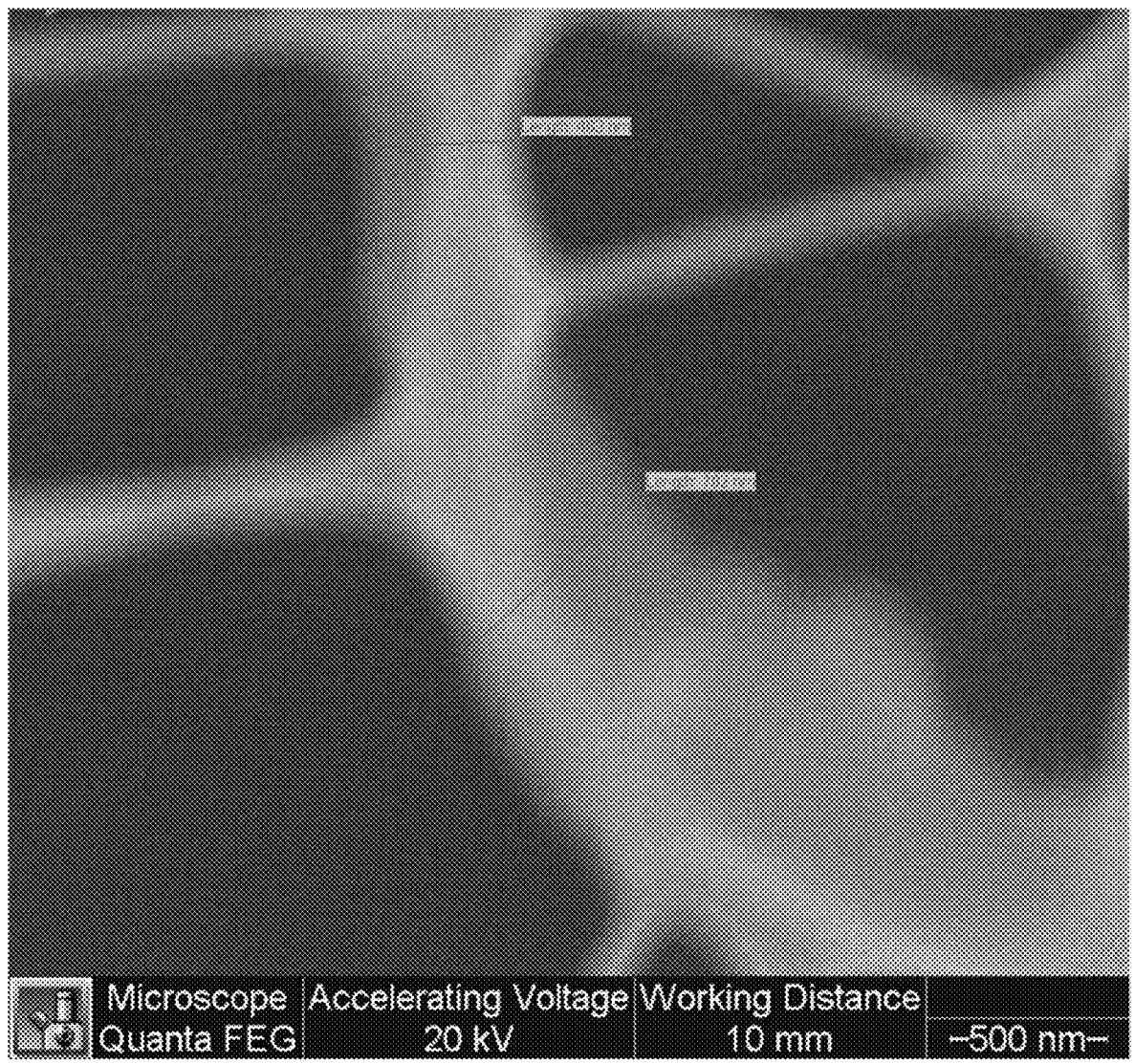
FIG. 4C is a photograph showing silicon nano-plates, the photograph was taken using a Scanning Electron Microscope (SEM)
Figure 5A:
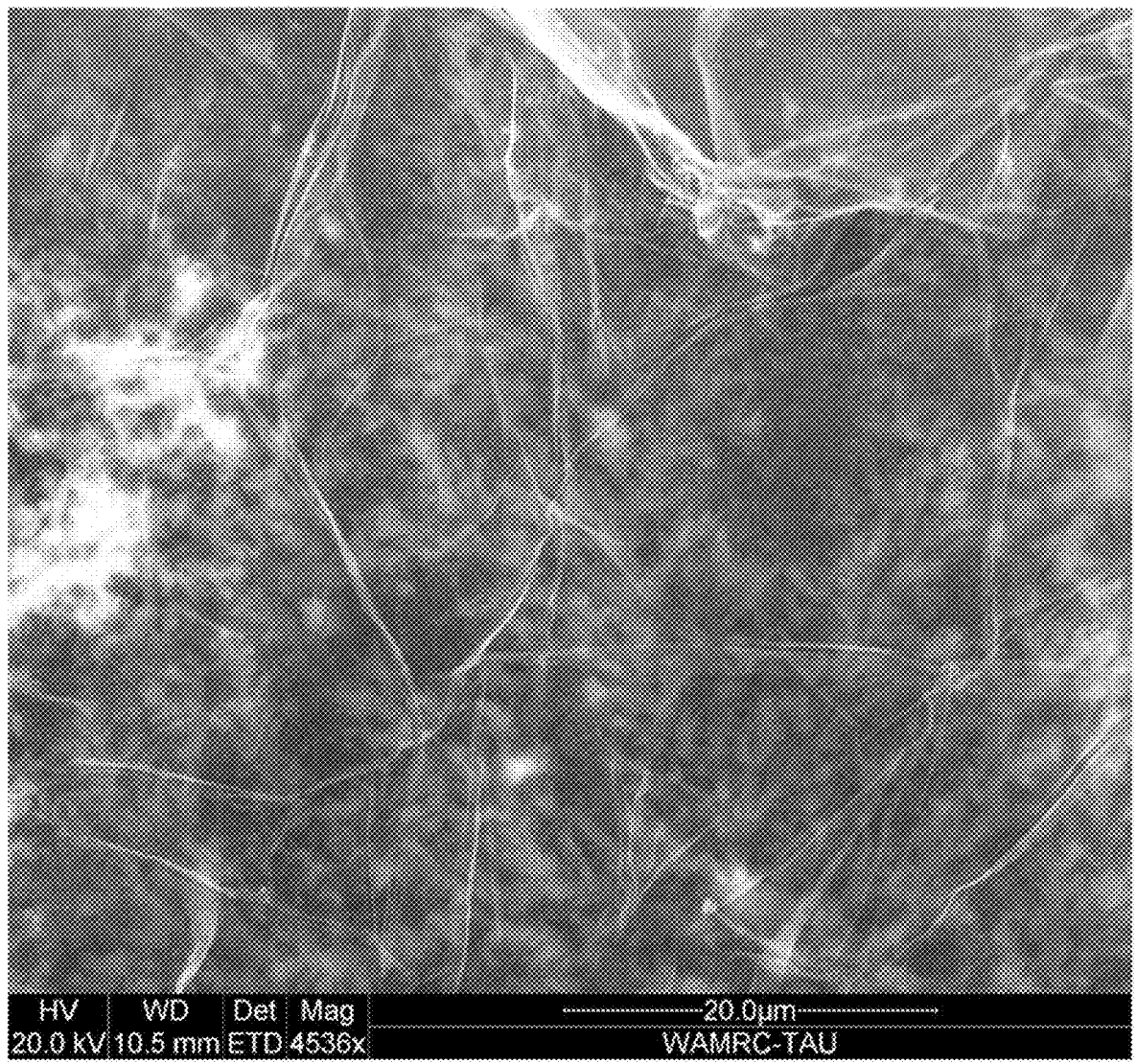
FIGS. 5A, 5B and 5C are photographs showing silicon nanowires and/or plates growing on a mesh and in a solution, the photographs were taken using a Scanning Electron Microscopy (SEM)
Figure 5B:
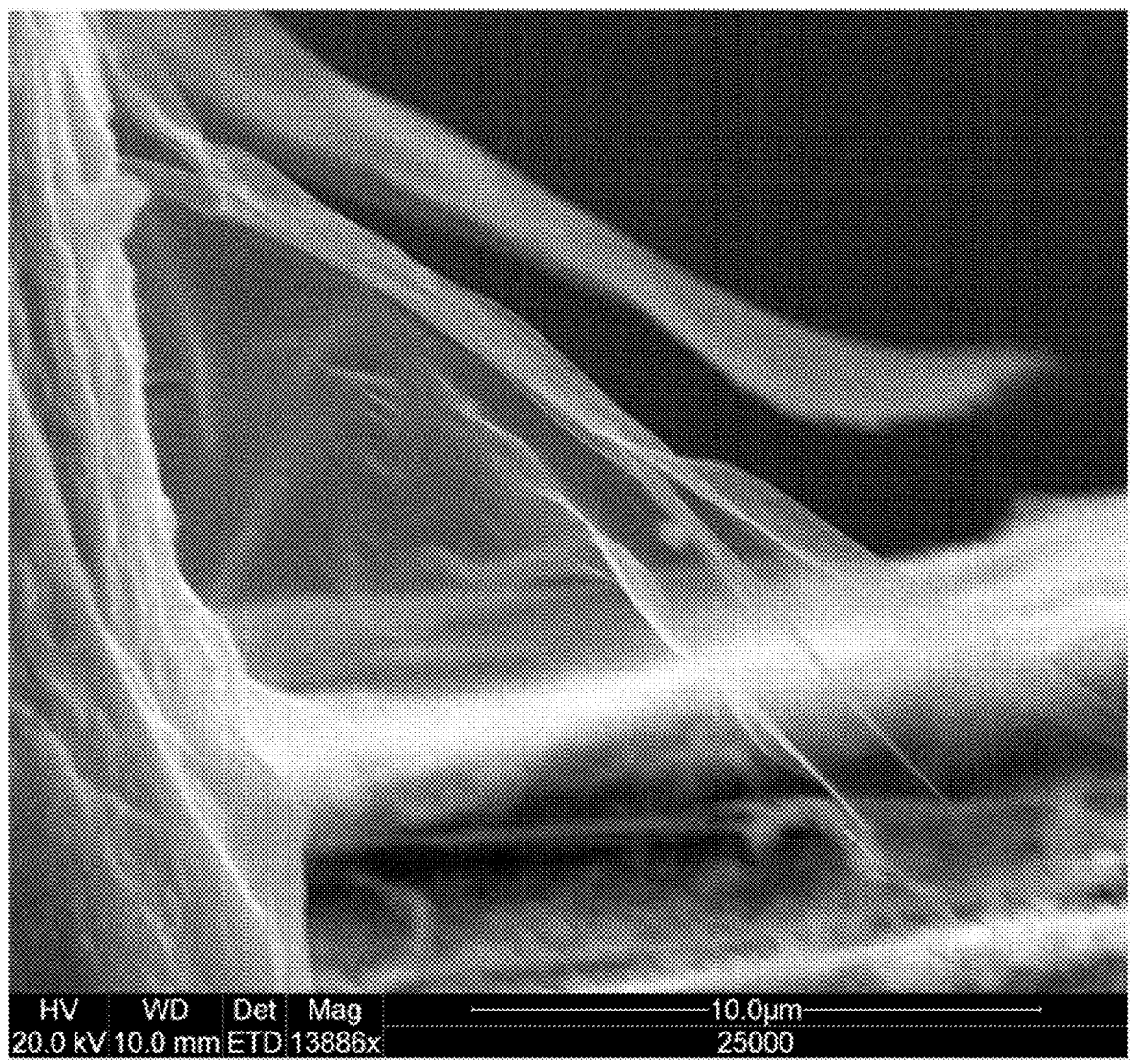
Figure 5C:
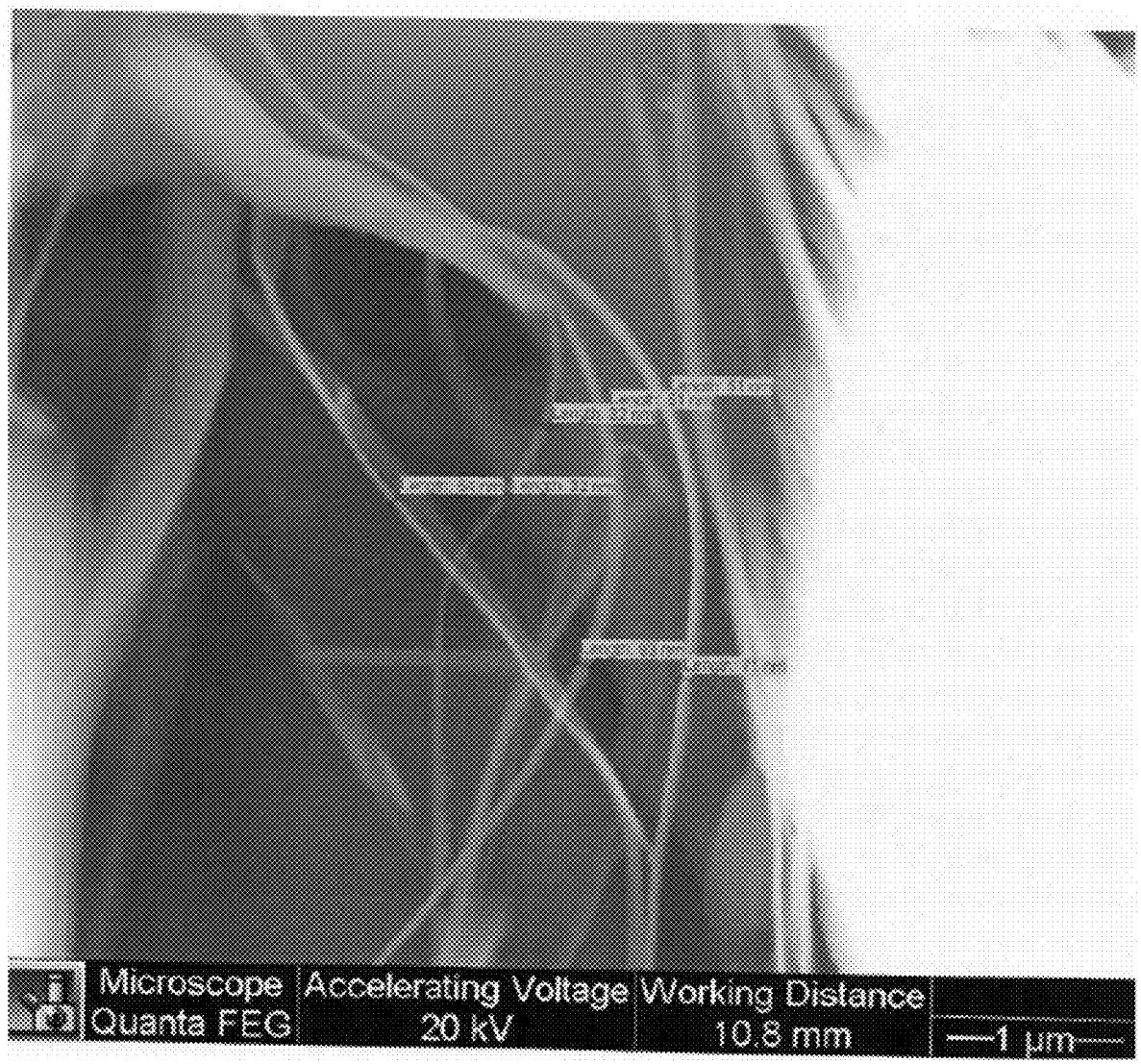
Figure 5D:
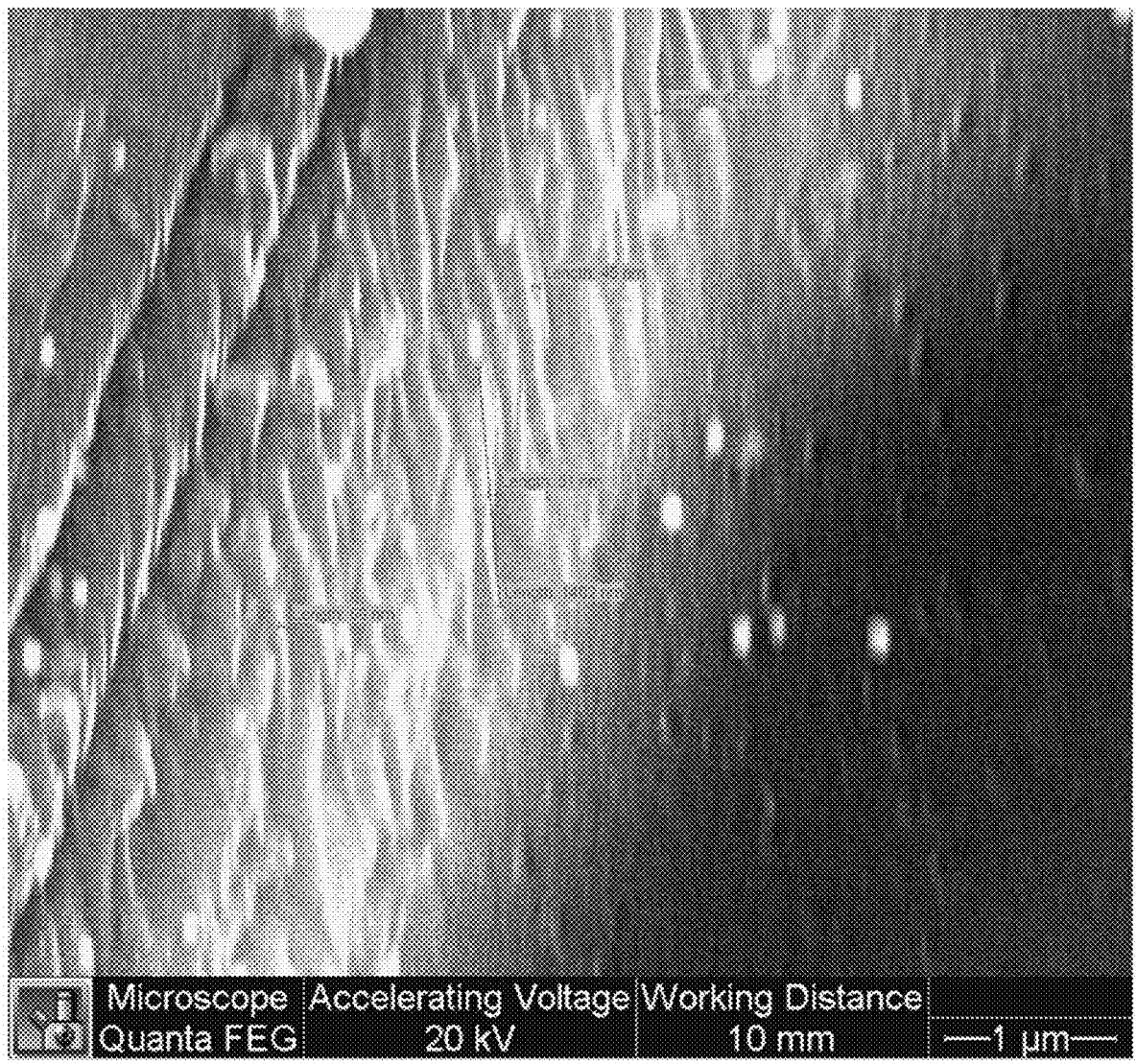
FIG. 5D is a photograph showing silicon nanowire growing on Carbon in a solution, the photograph was taken using a Scanning Electron Microscope (SEM)
Figure 6:
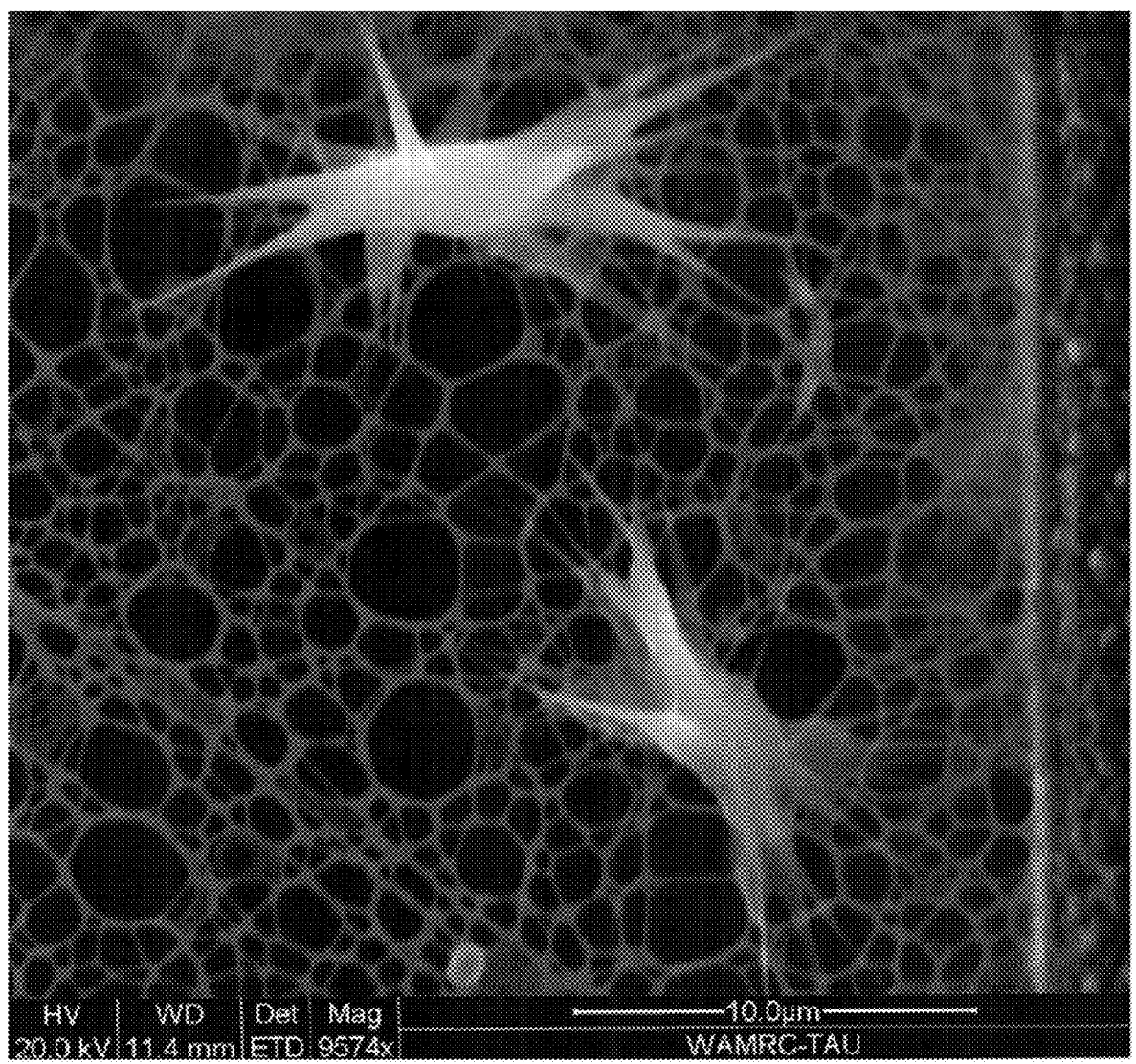
FIG. 6 is a photograph showing silicon nanowires in a solution without the use of a short organic compound as a buffer, the photograph shows that silicon nanowires may stick to each other, the photograph was taken using a Scanning Electron Microscope (SEM)

The metallic compound used, may take any form, shape and/or design as long as it mainlines its fundamental metallic characteristics. For example, it may be shaped as a mesh, nanoparticles, and/or any combination thereof. Furthermore, the metallic compound may vary between different metals. For example, it may be comprised from gold, silver, stainless still, copper, a combination thereof and/or any compound possessing metallurgy characteristic. For example, FIG. 5C shows that nanowires may form when using copper as a catalyst and FIG. 5D shows that nanowires may form when using carbon, which was dipped in a solution containing silver ions, as a catalyst. However, the physical structure of the metallic compound, for example its shape, size and/or design, may influence the production process of silicon nanowires and/or plates. For example, the width of the nanowires may vary for 32 nm to 93 nm as presented in FIGS. 4A, 4B, 4C, 5C and 5D. However, when using metallic mesh 204 as the metallic compound, for example as illustrated in FIGS. 2 and 3, both nanowires and plates may be formed in solution 206 and on top of mesh 204. As can be seen in FIGS. 4C, 7A, 7B, 7C and 7D, which show photographs of the formation of silicon nanowires and plates in a solution using a metallic mesh as a catalyst, using a Scanning Electron Microscope (SEM). However, when using metallic nanoparticles, which may be smaller than 40 nanometers, silicon nanowires may be produced in the solution, for example, as shown in FIGS. 5A, 5D and FIG. 6.

As indicated in blocks 112, 114 and 116, sodium methyl Siliconate ($CH_5NaO_3Si$), Ethylenediaminetetraacetic Acid (EDTA) and Sodium Diethyldithiocarbamate ($C_5H_{10}NS_2Na$) may be introduced into solution 206, containing, for example 100 cc of distilled water, as illustrated in FIGS. 2 and 3. Sodium methyl siliconate may be introduced into the solution at a concentration of between 20 cc to 50 cc per 100 cc of said solution. EDTA may be introduced into the solution at a concentration of between 0.35 gr to 0.55 gr per 100 cc of said solution. Sodium Diethyldithiocarbamate may be introduced into the solution at a concentration of between 0.35 gr to 0.6 gr per 100 cc of said solution. According to some embodiments of the present invention, these concentration may enable the mixture of the required solution, which may enable the production of silicon nanowires and/or plates.

As indicated in block 106, the compounds may be stirred thorough the process, forming a homogenized solution, as illustrated in FIGS. 2 and 3. Once the compounds are inserted into solution 206 they may interact with each other. For example, the EDTA may act as a first chelating agent e.g. EDTA may be used as a chelating agent for the metallic compound. For example, EDTA may bond with the metallic compound, rearranging its chemical composition, e.g. reorganizing the metallic compound's ions and/or core structure. Using a chelating agent, may improve the metallic compound's likelihood to bond with other substances, e.g. EDTA may enhance the metallic compound's affinity to bond with, for example, sodium methyl siliconate.

The Sodium Diethyldithiocarbamate which may be introduced into solution 206, may act as a second chelating agent, e.g. Sodium Diethyldithiocarbamate may be used as a chelating agent for the Sodium methyl siliconate. For example, the Sodium Diethyldithiocarbamate may bond with the Sodium methyl siliconate, rearranging its chemical composition. Reorganizing the Sodium methyl siliconate's anions/ions and/or core structure, may result in increasing the silicon element/compound's, e.g. Si, affinity to bond with a catalyst, for example a metallic compound, to form silicon nanowires and/or plates.

As indicated above, using chelating agents a catalyst and an electron mediator may improve the production process of silicon nanowires and/or plates in the solution. FIGS. 4A, 4B and 4C show photographs of silicon nanowires and plates, which are formed in a solution containing KOH as an electron mediator, a metallic compound as a catalyst and EDTA and Sodium Diethyldithiocarbamate as chelating agents. The Figures were taken using a Scanning Electron Microscope (SEM). The Figures show an example of the width of the silicon nanowires or plates. For example, the width of the nanowires presented herein varies between 66 nm and 73 nm and the width of the nano-plates may vary be between 107 nm and 702 nm.

Furthermore, the ratio between the two chelating agents may determine the silicone nanowires' structure. For example, by introducing into solution 206 more EDTA compared to Sodium Diethyldithiocarbamate, the result may be the formation of longer and thinner silicon nanowires. However, when introducing into solution 206 less EDTA compared to Sodium Diethyldithiocarbamate, the result may be the formation of thicker and shorter silicon nanowires.

It should be noted that the presence and/or absence of a chelating agent, for example, Sodium Diethyldithiocarbamate may solely affect the efficiency and/or time of the reaction process. The absence of a chelating agent may not affect the formation of the silicon nanowires and/or plates when introducing Sodium Methyl Siliconate into said solution containing a metallic compound and/or other catalyst. One of the reasons may be, the presence of KOH and EDTA in said solution. KOH may act as an electron mediator, facilitating an ion transfer between the sodium methyl siliconate and the metallic compound. EDTA may act a chelating agent, enhancing the metallic compound's affinity to bond with, for example, sodium methyl siliconate. Therefore, the presence of KOH and EDTA may enable the production of some silicon nanowires and/or plates in solution 206. However, the presence of a Sodium Methyl Siliconate chelating agent, for example Sodium Diethyldithiocarbamate, in solution 206 may significantly increase the effectiveness and quality of the production of silicon nanowires and/or plates.

As indicated in block 118, a short organic compound may be introduced into solution 206, as illustrated in FIGS. 2 and 3. The short organic compound may act as a buffer. The short organic compound may be introduced into the solution at a concentration of between 0.15 gr to 0.25 gr per 100 cc of distilled water. Since solution 206 may be an alkaline solution, it may be important that the buffer introduced may be acidic. For example, Dimethyl acrylic acid may be introduced as a buffer. The short organic compound may react and bond with a chelating agent, for example, the second chelating agent, which may be Sodium Diethyldithiocarbamate. Since the Dimethyl acrylic acid may bond with the second chelating agent it may act as a controller. For example, by bonding with the second chelating agent, the Dimethyl acrylic acid may prevent the chelating agent from further bonding with the Sodium Methyl Siliconate. The presence of the Dimethyl acrylic acid may inhibit the bonding of Sodium Methyl Siliconate with a catalyst, for example a metallic compound. Therefore, by inserting the short organic compound into solution 206, a certain control over the process may be achieved. For example, Dimethyl acrylic acid may be used to enable control of the amount of silicon nanowires and/or plates formed in the solution, as shown in FIGS. 5B, 5C and 5D. By controlling the amount of nanowires and/or plates formed in the solution, the formation of agglomeration may be prevented. The formation of agglomeration may cause the silicon nanowires and/or plates to stick to each other as can be seen in FIG. 6, which may prevent a successful separation of the silicon nanowires and/or plates from each other. When stuck together, the silicon nanowires and/or plates may not be used.

As indicated in block 120, after the production of the silicon nanowires and/or plates is completed, the products, e.g. silicon nanowires and/or plates, may be extracted from solution 206 and may be separated from potential byproducts. The extraction may be comprised from a few steps, for example warming solution 206 to at least 100° C. under atmospheric pressure. Warming solution 206 to such high temperatures may destroy the structural formation of the byproducts and may also evaporate some of the solution. Therefore, after heating solution 206, containing for example 100 cc of distilled water, for about two to three hours, solution 206 may be concentrated to about 30 cc. Once solution 206 is concentrated to about 30 cc, 20 cc to 30 cc of ethanol may be added to basin 202 and the new solution may then be reheated to at least 100° C. The new solution may be kept worm until it may be concentrated back to about 30 cc. After the new solution may be concentrated for the second time, 20 cc-30 cc of ethanol may be added to basin 202. The newer solution may then be untouched until two distinctive phases may be formed and/or appeared, for example after at least 3 hours. After at least 3 hours the silicon nanowires and/or plates may float on top of the upper phase of the newer solution and the byproducts and/or sediments may sink to the bottom phase of the newer solution in basin 202.

When using a metallic mesh, it may be extracted before, during and/or after the previously described cleaning process. The metallic mesh 204 may then be rinsed with distilled water and dried.

Turning now to FIG. 2 which is a schematic illustration of an exemplary basin 202 facilitating solution 206 enabling production of silicon nanowires and/or plates, according to some embodiments of the present invention. As illustrated in FIG. 2 Potassium Hydroxide (KOH), Sodium Methyl Siliconate ($CH_5NaO_3Si$), Ethylenediaminetetraacetic Acid (EDTA), Sodium Diethyldithiocarbamate ($C_5H10NS_2Na$) and Dimethyl acrylic acid may be well mixed in solution 206 and may interact with each other along with a catalyst, for example metallic mesh 204.

Figure 7A:
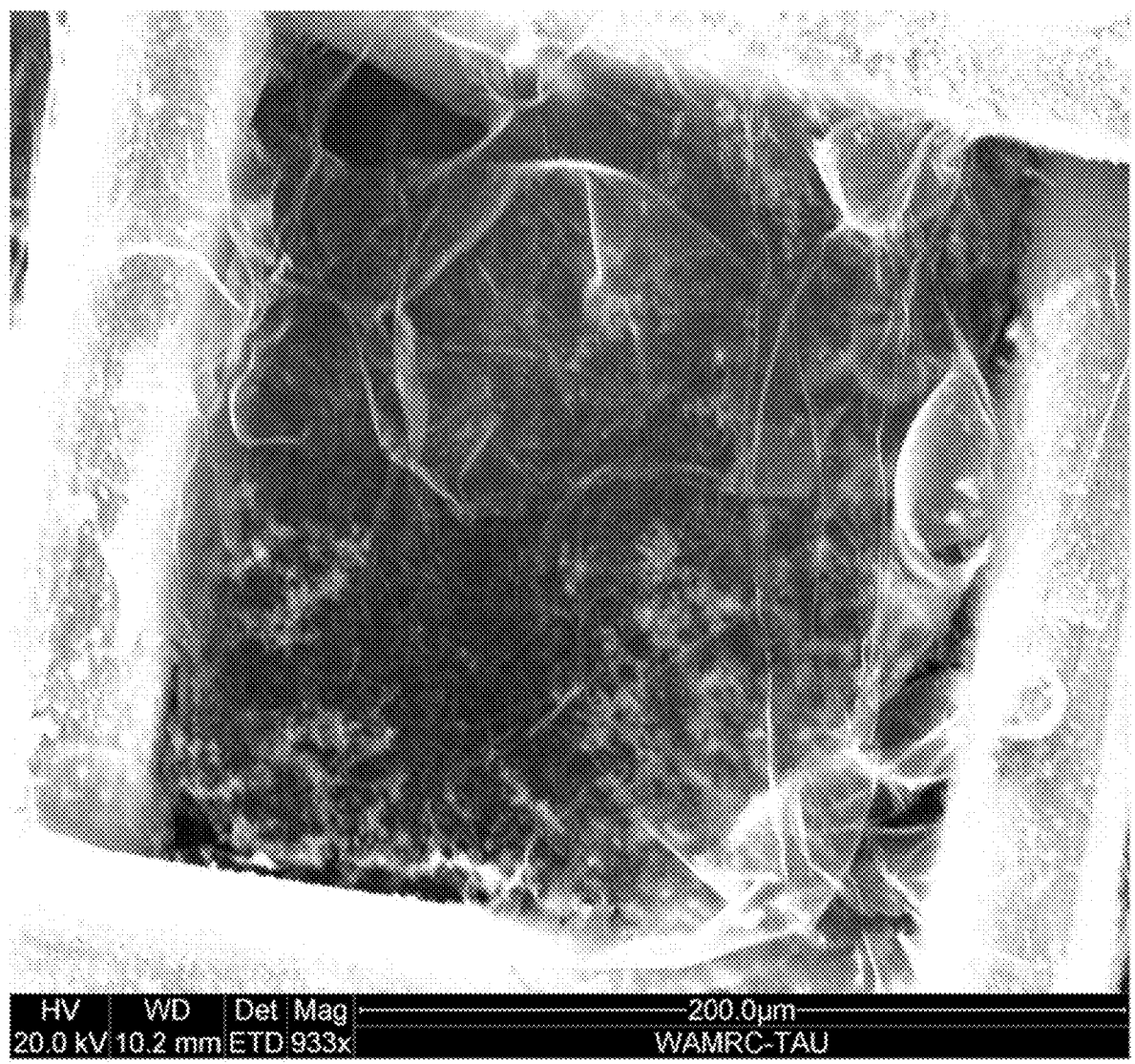
FIG. 7A is a panoramic photograph showing a mesh with silicon nanowires and plates, the photograph was taken using a Scanning Electron Microscope (SEM)
Figure 7B:
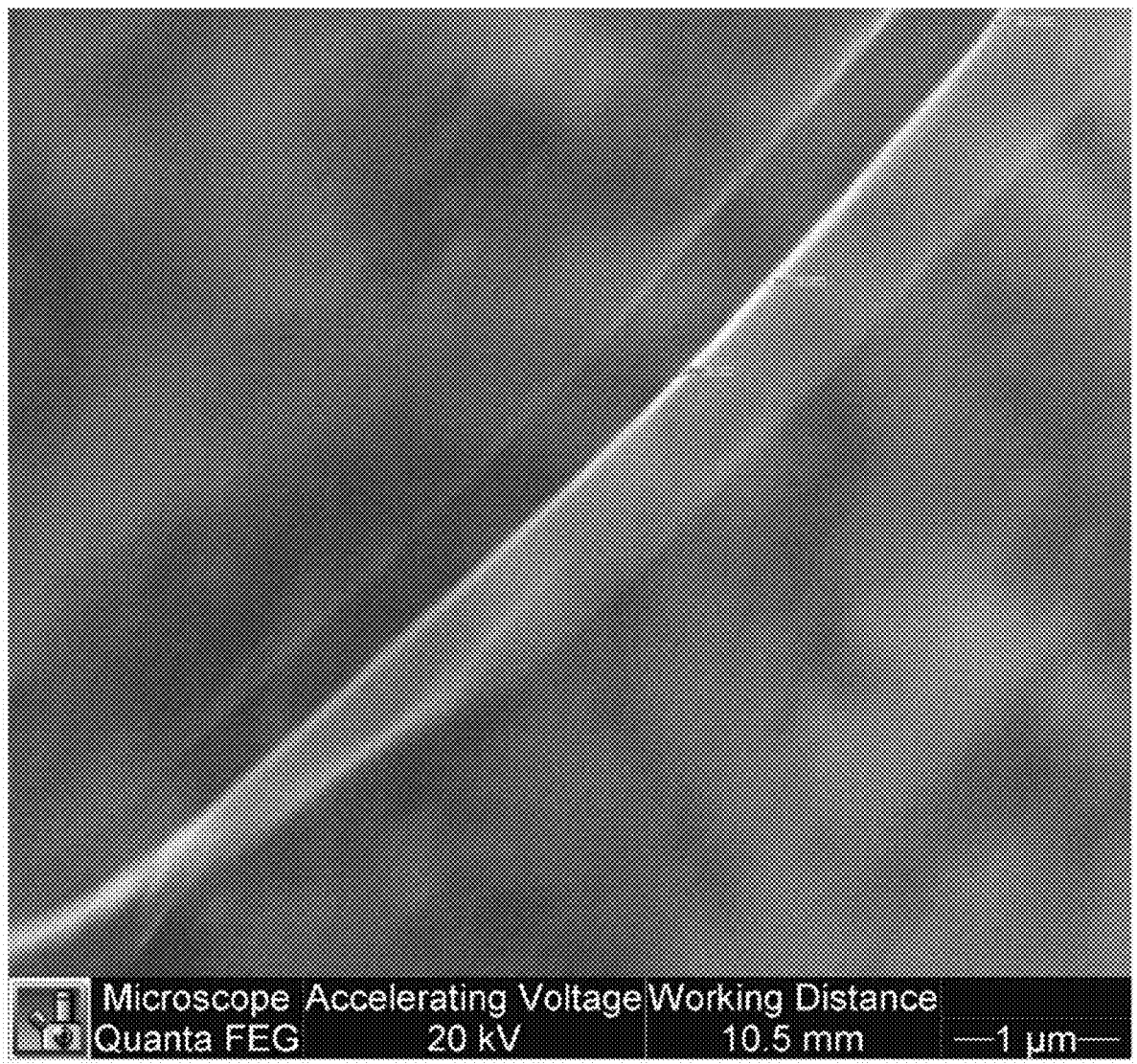
FIG. 7B is a photograph showing a silicon nanowire attached to a silicon nano-plate, the photograph was taken using a Scanning Electron Microscope (SEM)
Figure 7C:
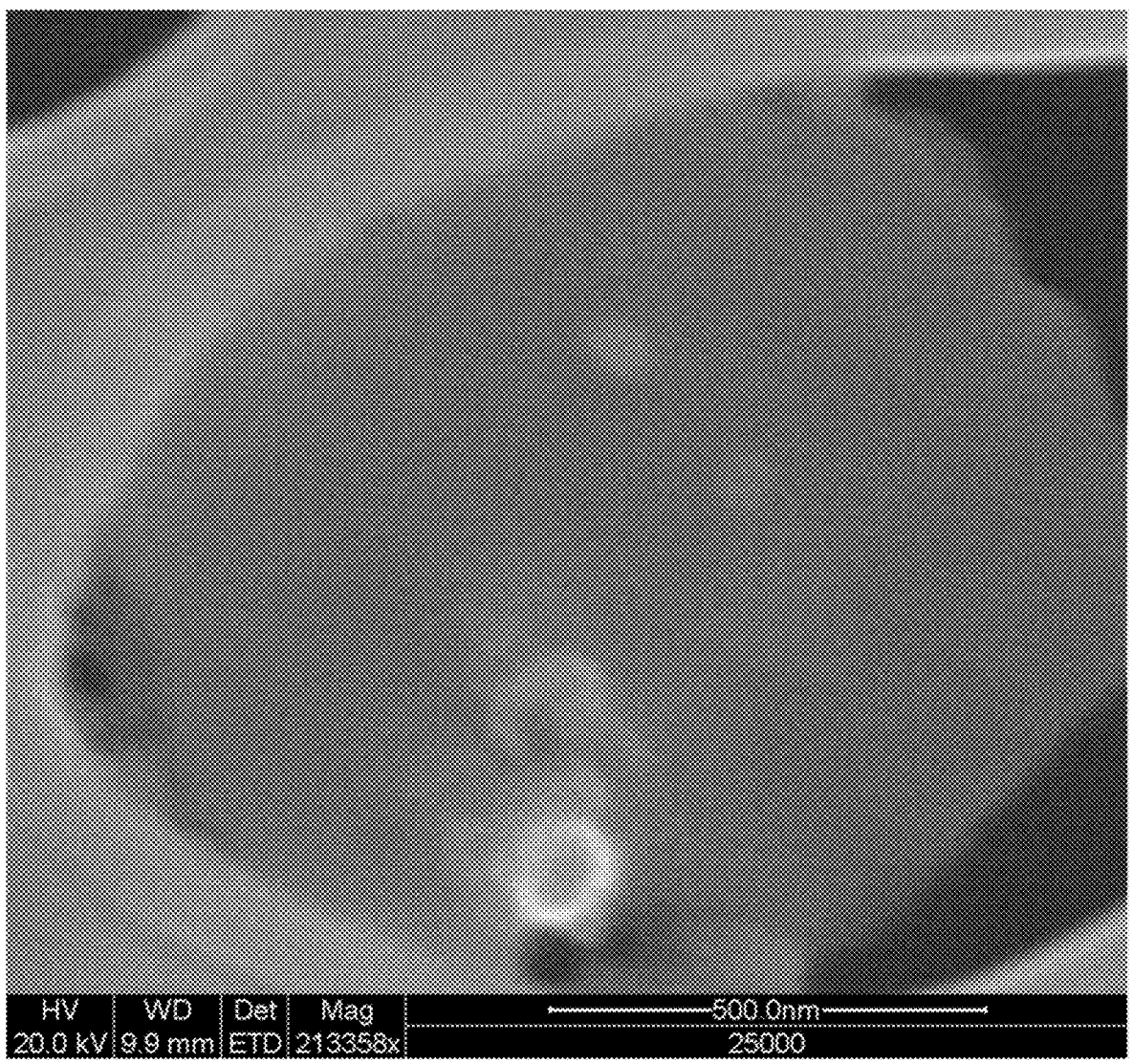
FIGS. 7C and 7D are photographs showing silicon nano-plates forming in a solution using a metallic mesh as the catalyst, the photographs were taken using a Scanning Electron Microscope (SEM)
Figure 7D:
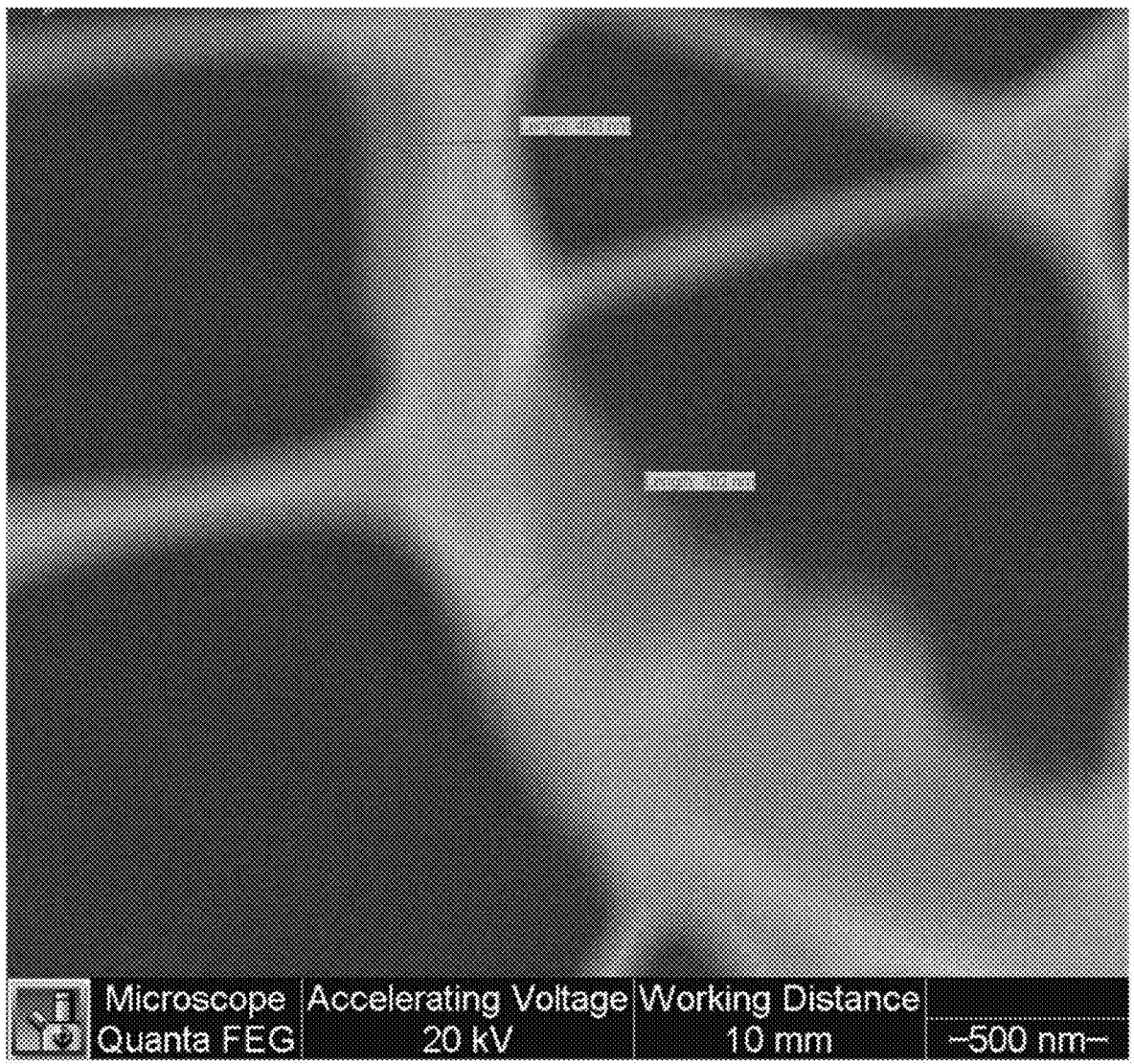

Turning now to FIG. 3 which is a schematic illustration of a reaction creating silicon nanowire 302 and/or silicon nano-plates 304 in an exemplary basin 202, facilitating solution 206, according to some embodiments of the present invention. As illustrated in FIG. 3 ions may transfer using a catalyst, for example metallic mesh 204, assisted by EDTA, which may act as chelating agent for the metallic compounds. The ion transfer mechanism may be assisted by KOH, which may act as an electron/ion mediator. As illustrated, a reaction may occur between the Sodium Methyl Siliconate, which may be assisted by Sodium Diethyldithiocarbamate, and the metallic compound. Sodium Diethyldithiocarbamate may act as a second chelating agent, bonding with the Sodium Methyl Siliconate, which may lower the energy activation point of the reaction between the Sodium Methyl Siliconate and other compounds, for example metallic compound 204. As illustrated, the reaction may result in the formation of silicon nanowires 302 and/or plates 304. It should be noted that the formation of silicon nano plates 304, as shown in FIGS. 7B, 7C and 7D, may be possible only when using a catalyst, for example metallic compound, in the structural form of a mesh, for example, mesh 204. However, the formation of silicon nanowires 302 may occur in solution 206, when using any form of catalyst, for example a metallic compound. For example, by using nano metallic particles, which may be smaller than 40 nanometer, and/or in the form of a mesh. For example, as shown in FIGS. 5B, 5C and 5D.

Figure 8A:
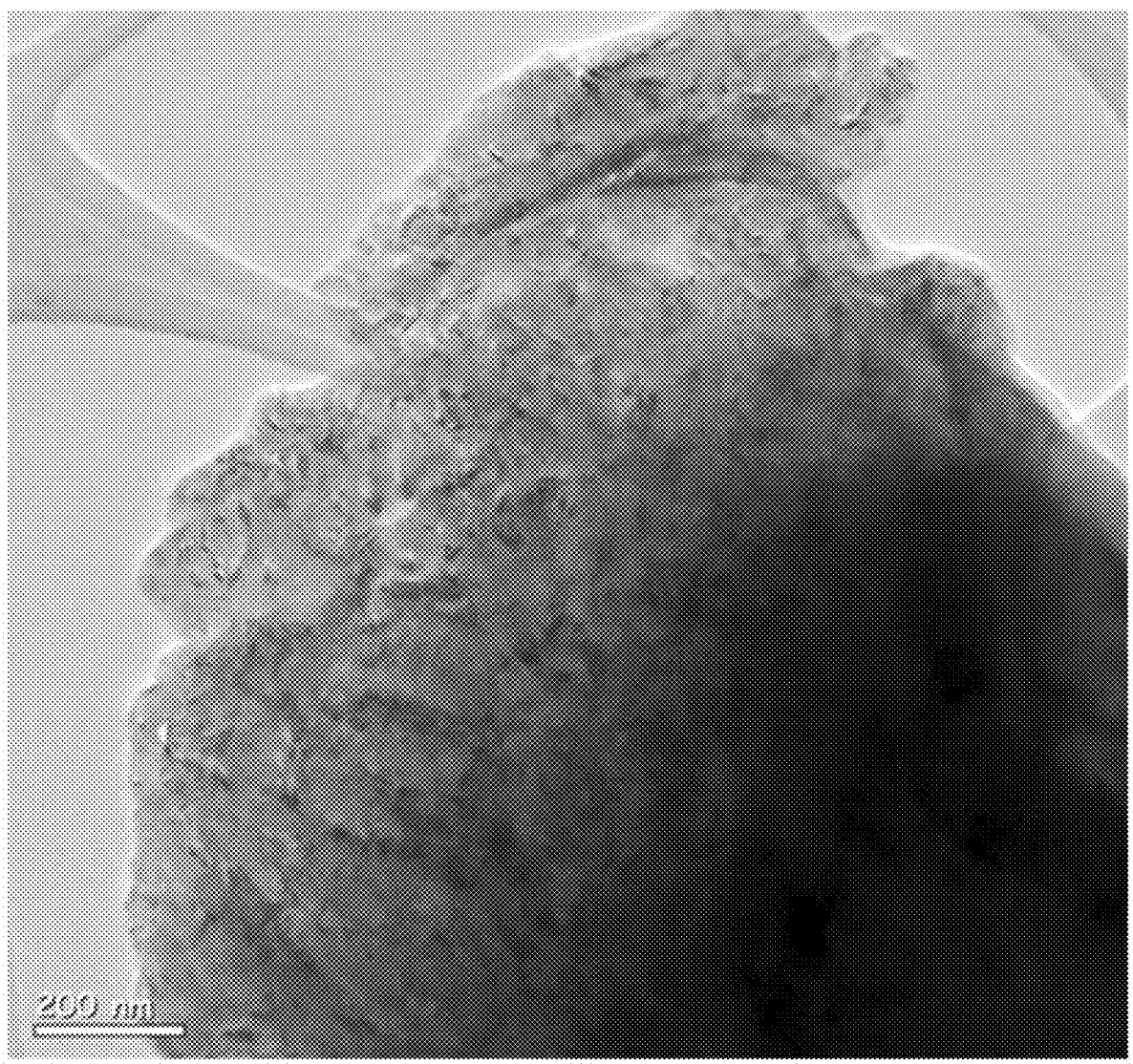
FIGS. 8A and 8B are photographs showing silicon nano-plates forming in a solution using a metallic mesh as the catalyst, the photographs were taken using a Transmission Electron Microscopy (TEM)
Figure 8B:
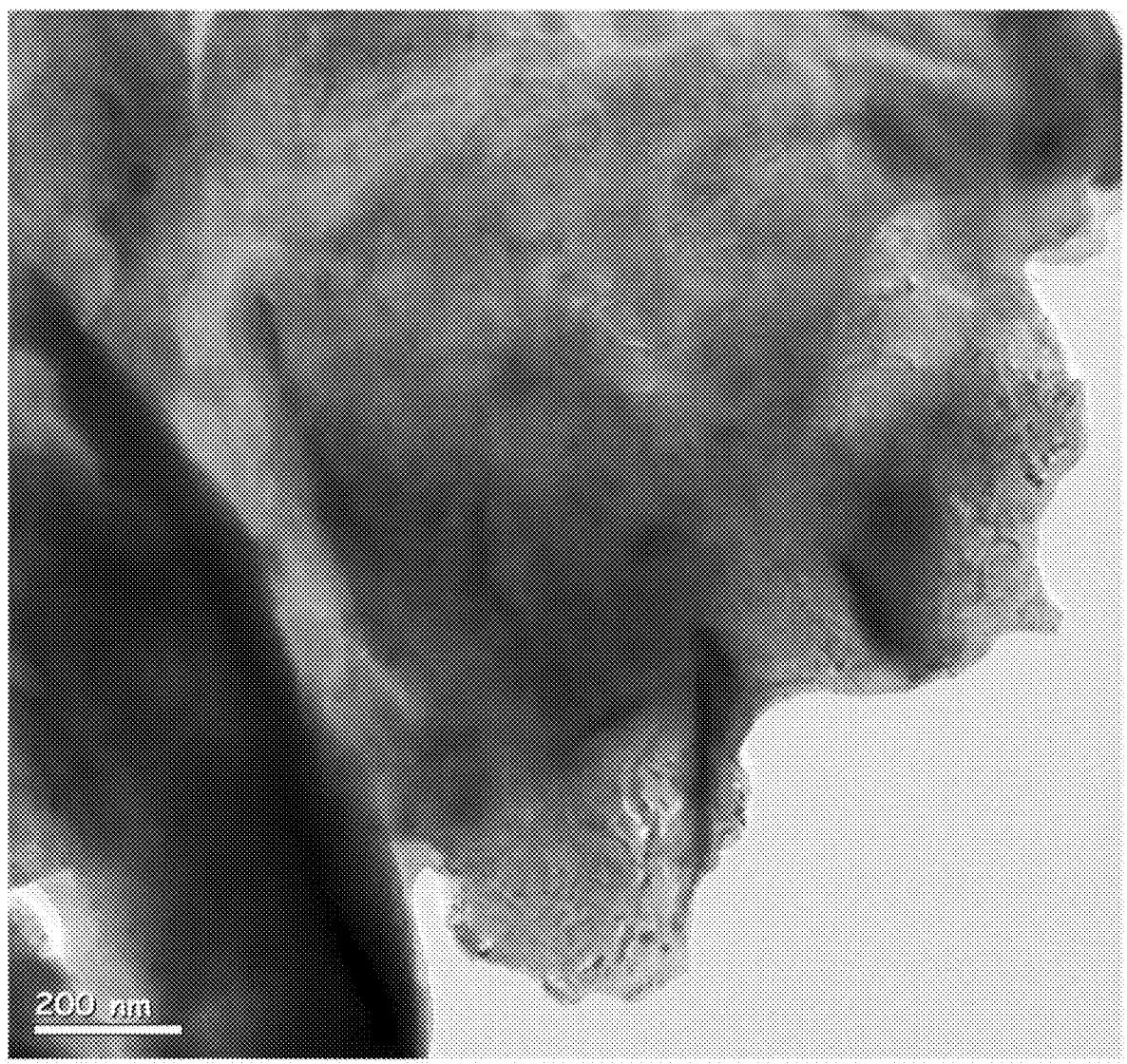
Figure 8C:
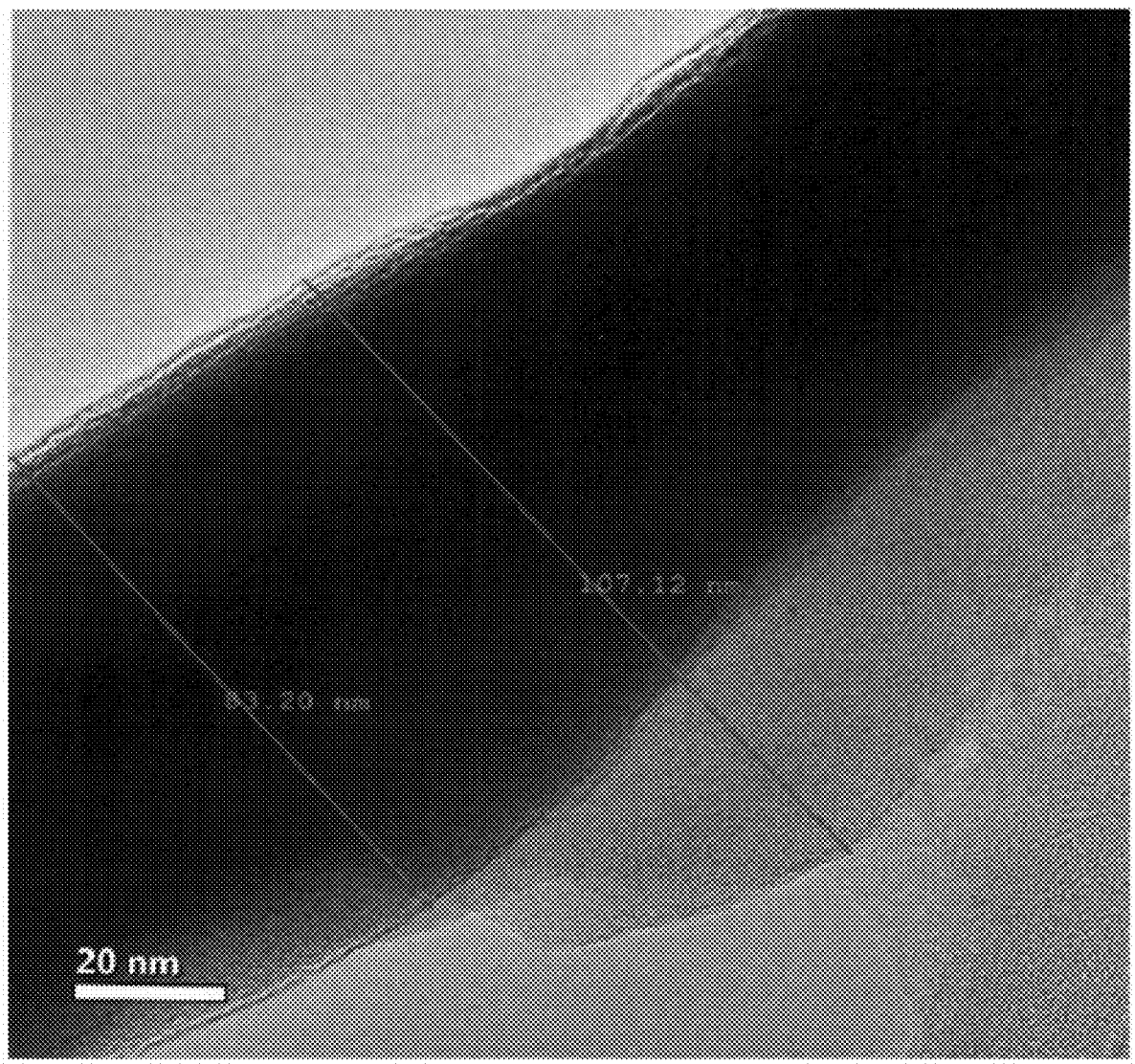
FIGS. 8C and 8D are photographs showing silicon nanowires and plates forming in a solution using a metallic mesh as the catalyst, the photographs were taken using a Transmission Electron Microscopy (TEM)
Figure 8D:
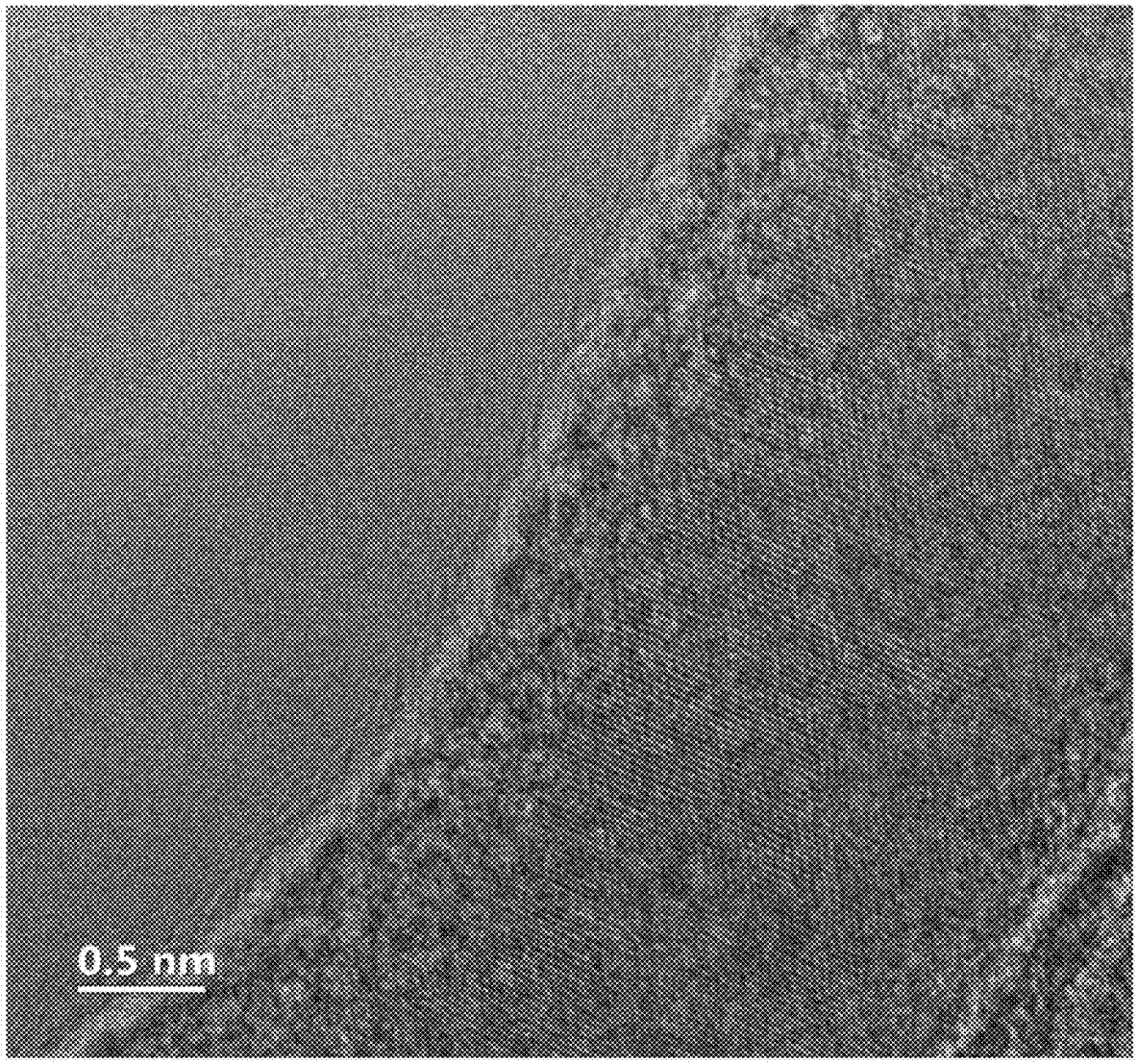

Turning now to FIGS. 8A, 8B. 8C and 8D, which are photographs showing silicon nanowires and plates forming in a solution using a metallic mesh as the catalyst. The photographs were taken using a Transmission Electron Microscopy (TEM). Using a TEM may enable a person skilled in the art to see that the formation of the silicon nanowires and/or plates may be comprised out of pure silicon, e.g. that the silicon nanowires and/or plates are creating a crystal formation. For example, FIG. 8C shows a clear structure of the silicon nanowire. Moreover, in FIG. 8D a person skilled in the art may clearly see that the atoms comprising the silicon nanowire are lined up in a fixed formation. The clear and fixed formation presented in the Figures may suggest that silicon nanowires and/or plates create a crystal formation and are comprised from pure silicon.

Figure 9A:
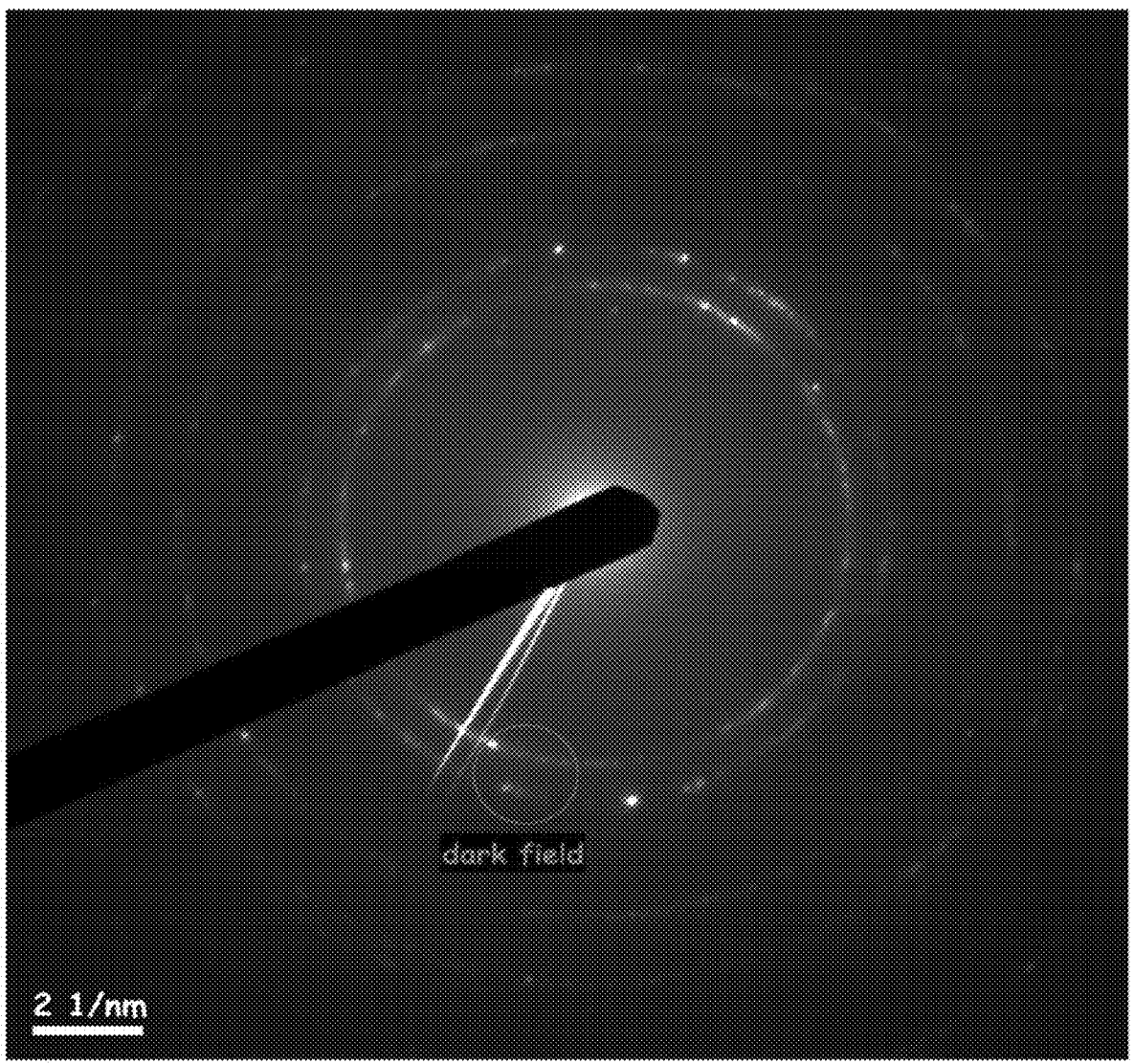
FIG. 9A is a photograph showing the diffraction of a silicon nano-plate, as presented in FIGS. 8A and 8B, presenting a crystal formation of the silicon compound, the photographs were taken using a Transmission Electron Microscopy (TEM)
Figure 9B:
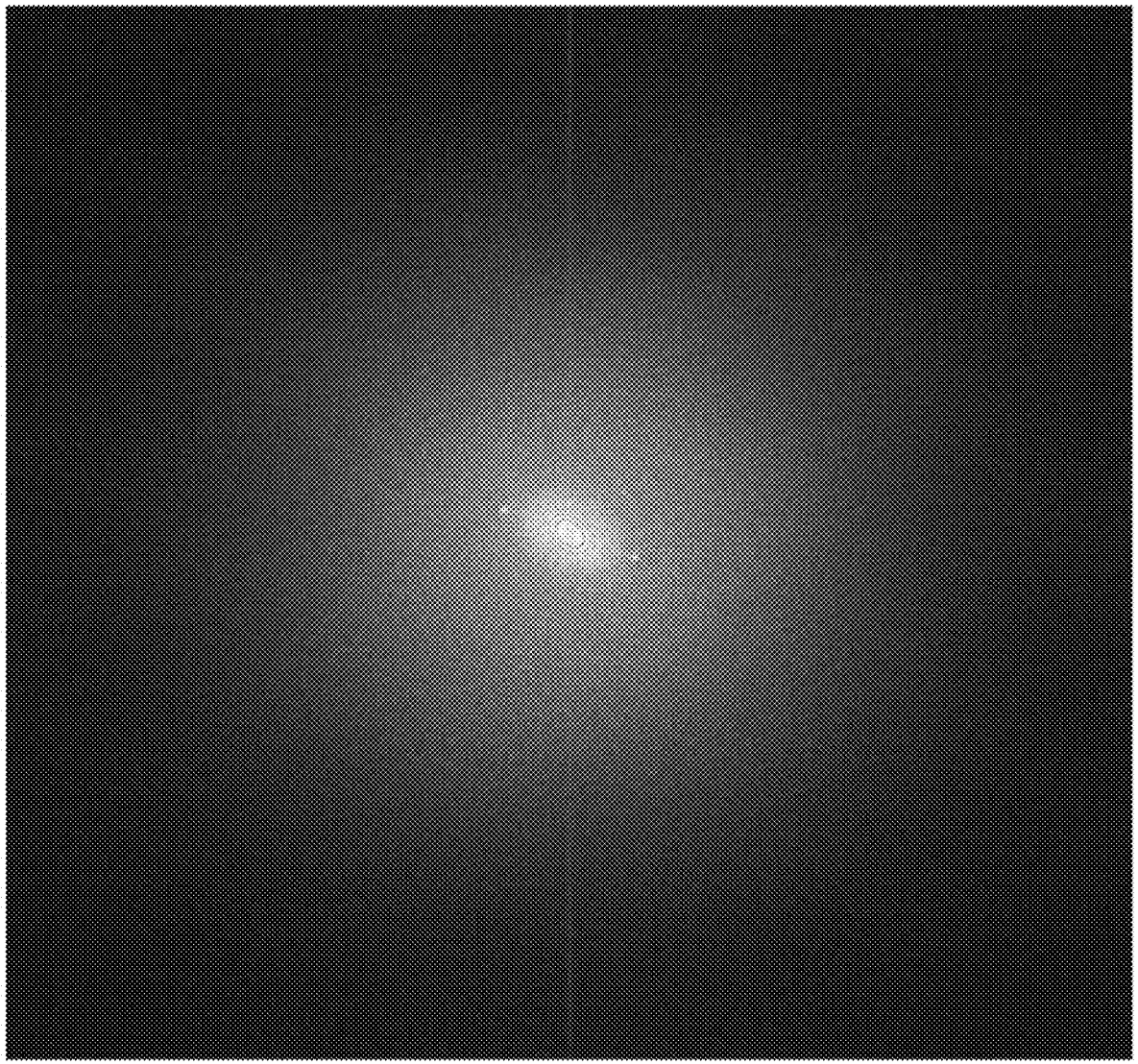
FIG. 9B is a Fast Fourier Transform (FFT) photograph showing the diffraction of a silicon nano-plate, as presented in FIGS. 8C and 8D, presenting a crystal formation of the silicon compound, the photograph was taken using a Transmission Electron Microscopy (TEM)

Turning now to FIGS. 9A and 9B which are photographs, showing the diffraction of a silicon nano-plate, as presented in FIGS. 8A, 8B, 8C and 8D, presenting a crystal formation of the silicon compound. The photographs were taken using a Transmission Electron Microscopy (TEM) and a Fast Fourier Transform (FFT) method. Using a TEM, may enable a use of a FFT method which may further verify that the formation of the silicon nano-plats may be comprised out of pure silicon. The silicon nanowires and/or silicon nano-plates presented in FIGS. 8A, 8B, 8C and 8D were further tested using a diffraction and/or a FFT methods and are presented in FIGS. 9A and 9B. A person skilled in the art may identify that FIGS. 9A and 9B further verify that the silicon nano-plates create a crystal formation. Furthermore, since the photographs show a diffraction of a crystal structure of the silicon nano-plate, most of the silicon nano-plate presented may not be thicker than 120 n.

Silicon nanowires and plates that are thinner than 120 nm may possess the ability to dynamically change their electrical resistance and therefore may be used in the microelectronics industry, for example, in the semiconductors industry. Therefore, forming silicon nanowires and/or plates presenting a crystal formation with a thickness that may be thinner than 120 nm, such as disclosed above, may be desired in the microelectronics industry.

Figure 10:
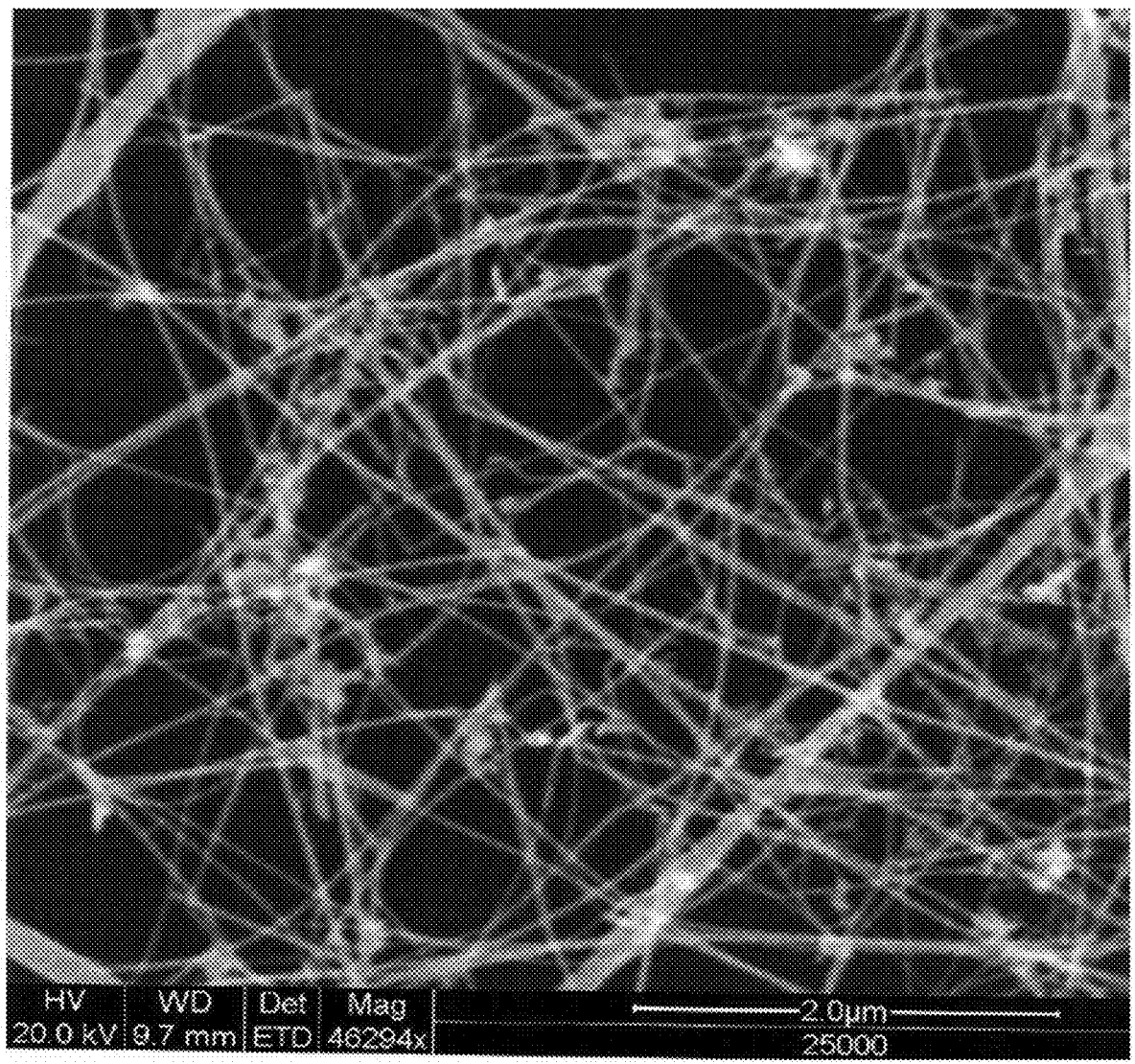
FIG. 10 is a photograph showing silicon nanowires which were formed using a CVD method, the photograph was taken using a Scanning Electron Microscope (SEM).

Turning now to FIG. 10 which is a photograph showing silicon nanowires, which were formed using a CVD method, the photograph was taken using a Scanning Electron Microscope (SEM). When comparing the nanowires presented in FIG. 10 to the silicon nanowires presented in FIGS. 5C, 5D and 7A, a person skilled in the art may clearly notice the difference in the structure unity of the silicon nanowires and size, for example length and/or thickness. Furthermore, as previously indicated using a CVD method may not enable a user to produce silicon nano-plates or to control the variation between length and/or thickness.

In the context of some embodiments of the present disclosure, by way of example and without limiting, terms such as 'operating' or 'executing' imply also capabilities, such as 'operable' or 'executable', respectively.

Conjugated terms such as, by way of example, 'a thing property' implies a property of the thing, unless otherwise clearly evident from the context thereof.

The term 'configuring' and/or 'adapting' for an objective, or a variation thereof, implies using at least a software and/or electronic circuit and/or auxiliary apparatus designed and/or implemented and/or operable or operative to achieve the objective.

A device storing and/or comprising a program and/or data constitutes an article of manufacture. Unless otherwise specified, the program and/or data are stored in or on a non-transitory medium.

In case electrical or electronic equipment is disclosed it is assumed that an appropriate power supply is used for the operation thereof.

The flowchart and block diagrams illustrate architecture, functionality or an operation of possible implementations of systems, methods and computer program products according to various embodiments of the present disclosed subject matter. In this regard, each block in the flowchart or block diagrams may represent a module, segment, or portion of program code, which comprises one or more executable instructions for implementing the specified logical function(s). It should also be noted that, in some alternative implementations, illustrated or described operations may occur in a different order or in combination or as concurrent operations instead of sequential operations to achieve the same or equivalent effect.

The corresponding structures, materials, acts, and equivalents of all means or step plus function elements in the claims below are intended to include any structure, material, or act for performing the function in combination with other claimed elements as specifically claimed. As used herein, the singular forms "a", "an" and "the" are intended to include the plural forms as well, unless the context clearly indicates otherwise. It will be further understood that the terms "comprising", "including" and/or "having" and other conjugations of these terms, when used in this specification, specify the presence of stated features, integers, steps, operations, elements, and/or components, but do not preclude the presence or addition of one or more other features, integers, steps, operations, elements, components, and/or groups thereof.

The terminology used herein should not be understood as limiting, unless otherwise specified, and is for the purpose of describing particular embodiments only and is not intended to be limiting of the disclosed subject matter. While certain embodiments of the disclosed subject matter have been illustrated and described, it will be clear that the disclosure is not limited to the embodiments described herein. Numerous modifications, changes, variations, substitutions and equivalents are not precluded.

The invention claimed is:

1. A composition of a 100 cc solution for a production of silicon nanowires or silicon nano-plates, said 100 cc solution comprising:
   distilled water;
   1 to 3 grams of Potassium Hydroxide (KOH);
   at least one catalyst comprising at least one metallic compound;
   20 to 50 cc of Sodium Methyl Siliconate ($CH_5NaO_3Si$);
   0.35 to 0.55 grams is of Ethylenediaminetetraacetic Acid (EDTA), which act as a first chelating agent;
   0.35 to 0.6 grams of Sodium Diethyldithiocarbamate ($C_5H_{10}NS_2Na$), which acts as a second chelating agent; and
   0.15 to 0.25 grams of Dimethylacrylic Acid, which acts as a buffer to regulate an amount of silicon nanowires or silicon nano-plates formed and to prevent agglomeration.

2. The composition of claim 1, wherein the at least one metallic compound comprises gold, silver, copper, stainless steel and a combination thereof.

3. A method for creating a solution for a production of silicon nanowires or silicon nano-plates, said method comprising:
   introducing distilled water into a basin;
   introducing Potassium Hydroxide (KOH) which acts as an electron mediator into said basin;
   forming a homogenized solution;
   warming said homogenized solution between 75 to 95 degrees Celsius and keeping the homogenized solution below boiling point;
   introducing at least one catalyst comprising at least one metallic compound into said homogenized solution;
   introducing Sodium Methyl Siliconate into said homogenized solution;
   introducing Ethylenediaminetetraacetic Acid (EDTA), which acts as a first chelating agent into said homogenized solution;
   introducing Sodium Diethyldithiocarbamate ($C_5H_{10}NS_2Na$), which acts as a second chelating agent into said homogenized solution; and
   introducing Dimethylacrylic Acid into said homogenized solution;
   thereby creating the solution for the production of silicon nanowires or silico nano-plates;
   wherein the silicon nanowires or silicon nano-plates are formed using the at least one catalyst;
   wherein the Dimethylacrylic Acid, acts as a buffer to control an amount of silicon nanowires or silicon nano-plates formed and to prevent agglomeration,
   wherein the method controls forming longer and thinner silicon nanowires by introducing more EDTA compared to Sodium Diethyldithiocarbamate, and forming shorter and thicker silicon nanowires by introducing less EDTA compared to Sodium Diethyldithiocarbamate.

4. The method of the claim 3, wherein the at least one metallic compound comprises gold, silver, copper, stainless steel and a combination thereof.

5. The method of the claim 3, wherein the at least one metallic compound includes nano metallic particles smaller than 40 nanometer.

6. The method of claim 3, wherein said introducing KOH is in an amount higher than a 0.5 grams per 100 cc of said solution.

7. The method of claim 3, wherein said introducing KOH is between 1 to 3 grams per 100 cc of said solution,
   wherein said introducing Sodium Methyl Siliconate is between 20 to 50 cc per 100 cc of said solution,
   wherein said introducing EDTA is between 0.35 to 0.55 grams per 100 cc of said solution,
   wherein said introducing $C_5H_{10}NS_2Na$ is between 0.35 to 0.6 grams per 100 cc of said solution, and
   wherein said introducing Dimethylacrylic Acid is between 0.15 to 0.25 grams per 100 cc of said solution.

8. The method of claim 3, further comprises extracting the silicon nanowires or silicon nano-plates from said solution, which further comprises of:
   warming the basin to at least 100 degrees Celsius to evaporate the solution thereby concentrating the solution from 100 cc to 30 cc;

adding between 25-35 cc of ethanol to the basin;
warming the basin to at least 100 degrees Celsius to evaporate the solution thereby concentrating the solution from 50 cc to 30 cc; and
adding to the basin between 25-35 cc of ethanol and letting the solution rest until two distinctive phases are formed in the solution;
wherein the silicon nanowires or silicon nano-plates float on top of an upper phase and the byproducts sink in a lower phase.

* * * * *